(12) United States Patent
Chung et al.

(10) Patent No.: US 11,133,184 B2
(45) Date of Patent: Sep. 28, 2021

(54) STAGGERED-TYPE TUNNELING FIELD EFFECT TRANSISTOR

(71) Applicants: Taiwan Semiconductor Manufacturing Company, Ltd., Hsinchu (TW); National Chiao-Tung University, Hsinchu (TW)

(72) Inventors: Steve S. Chung, Hsinchu (TW); E. Ray Hsieh, Kaohsiung (TW); Kuan-Yu Chang, New Taipei (TW)

(73) Assignees: Taiwan Semiconductor Manufacturing Company, Ltd., Hsin-Chu (TW); National Chiao Tung University, Hsin-Chu (TW)

( * ) Notice: Subject to any disclaimer, the term of this patent is extended or adjusted under 35 U.S.C. 154(b) by 4 days.

(21) Appl. No.: 16/595,054

(22) Filed: Oct. 7, 2019

(65) Prior Publication Data
US 2020/0043727 A1 Feb. 6, 2020

Related U.S. Application Data

(63) Continuation of application No. 14/700,187, filed on Apr. 30, 2015, now Pat. No. 10,504,721.

(51) Int. Cl.
*H01L 29/06* (2006.01)
*H01L 21/02* (2006.01)
(Continued)

(52) U.S. Cl.
CPC .... *H01L 21/02428* (2013.01); *H01L 29/0692* (2013.01); *H01L 29/66977* (2013.01);
(Continued)

(58) Field of Classification Search
CPC ........... H01L 21/02428; H01L 29/7391; H01L 29/7851; H01L 29/0692; H01L 29/66977; H01L 29/49; H01L 29/7311; H01L 29/165; H01L 29/0843; H01L 29/66409; H01L 29/772; H01L 29/739; H01L 29/66356; H01L 29/78; H01L 29/66; H01L 29/0847;
(Continued)

(56) References Cited

U.S. PATENT DOCUMENTS 4,243,997 A 1/1981 Natori et al.
4,978,629 A * 12/1990 Komori ............... H01L 21/2257
257/E21.151
(Continued)

FOREIGN PATENT DOCUMENTS

CN 101740621 A 6/2010
CN 102832256 A 12/2012
(Continued)

*Primary Examiner* — Samuel Park
(74) *Attorney, Agent, or Firm* — Slater Matsil, LLP

(57) ABSTRACT

The disclosure describes a tunneling field effect transistor having an overlapping structure between the source and drain regions providing a greater tunneling area. The source or drain region may be a doped region in a semi-conductive substrate. The other source or drain region may be formed by epitaxial deposition over the doped region. The gate is formed over the epitaxial region where the doped and epitaxial regions overlap. The doped region may be formed in a fin structure with the epitaxial region and gate being formed on the top and sides of the fin.

20 Claims, 22 Drawing Sheets

(51) Int. Cl.
  *H01L 29/66*     (2006.01)
  *H01L 29/739*    (2006.01)
  *H01L 29/78*     (2006.01)
  *H01L 29/165*        (2006.01)
  *H01L 29/49*         (2006.01)
  *H01L 29/73*         (2006.01)

(52) U.S. Cl.
  CPC ...... *H01L 29/7391* (2013.01); *H01L 29/7851* (2013.01); *H01L 29/165* (2013.01); *H01L 29/49* (2013.01); *H01L 29/7311* (2013.01)

(58) Field of Classification Search
  CPC ......... H01L 21/02532; H01L 21/26586; H01L 29/04; H01L 29/42356; H01L 21/02381; H01L 27/105; H01L 27/11526; H01L 2924/0002; H01L 29/06; H01L 29/086; H01L 29/0878; H01L 29/20; H01L 29/42368; H01L 21/823456; H01L 27/0605; H01L 27/115; H01L 2924/00; H01L 29/08; H01L 29/152; H01L 29/51; H01L 29/73; H01L 29/66545; H01L 29/7848; H01L 29/785; H01L 29/517; H01L 29/0649; H01L 21/823807; H01L 21/823814; H01L 29/161; H01L 29/6659; H01L 29/1054; H01L 29/4966; H01L 29/66477; H01L 21/823821; H01L 29/41783; H01L 29/41791; H01L 29/7833
  See application file for complete search history.

(56) References Cited

U.S. PATENT DOCUMENTS

| | | | |
|---|---|---|---|
| 5,171,698 A * | 12/1992 | Shimoda | H01L 21/2257 257/E21.151 |
| 5,238,857 A * | 8/1993 | Sato | H01L 29/66772 257/E21.415 |
| 5,270,232 A * | 12/1993 | Kimura | H01L 21/28525 438/304 |
| 5,583,059 A | 12/1996 | Burghartz | |
| 6,177,303 B1 | 1/2001 | Schmitz et al. | |
| 6,617,643 B1 | 9/2003 | Goodwin-Johansson | |
| 8,120,115 B2 | 2/2012 | Vandenberghe et al. | |
| 8,148,220 B2 | 4/2012 | Verhulst et al. | |
| 8,258,031 B2 | 9/2012 | Lauer et al. | |
| 8,384,122 B1 * | 2/2013 | Hu | H01L 29/165 257/105 |
| 8,471,329 B2 | 6/2013 | Bhuwalka et al. | |
| 8,586,993 B2 | 11/2013 | Curatola et al. | |
| 8,587,075 B2 | 11/2013 | Bhuwalka et al. | |
| 2002/0011613 A1 | 1/2002 | Yagishita et al. | |
| 2002/0033508 A1 * | 3/2002 | Morikawa | H03F 3/193 257/368 |
| 2006/0029747 A1 | 2/2006 | Cruse et al. | |
| 2006/0258072 A1 | 11/2006 | Kavalieros et al. | |
| 2007/0048907 A1 | 3/2007 | Lee et al. | |
| 2008/0093626 A1 * | 4/2008 | Kuraguchi | H01L 29/2003 257/190 |
| 2008/0135973 A1 * | 6/2008 | Hikida | H01L 29/66621 257/492 |
| 2008/0283906 A1 | 11/2008 | Bohr | |
| 2010/0038713 A1 * | 2/2010 | Majhi | H01L 29/66545 257/344 |
| 2010/0123203 A1 | 5/2010 | Bhuwalka et al. | |
| 2010/0200916 A1 * | 8/2010 | Gossner | H01L 29/165 257/335 |
| 2011/0147838 A1 | 6/2011 | Gossner et al. | |
| 2012/0001238 A1 | 1/2012 | Tsai et al. | |
| 2012/0056273 A1 | 3/2012 | Ishii et al. | |
| 2012/0104509 A1 | 5/2012 | Matsumoto | |
| 2012/0153387 A1 | 6/2012 | Murthy et al. | |
| 2012/0288706 A1 | 9/2012 | Sugizaki et al. | |
| 2012/0298959 A1 | 11/2012 | Verhulst et al. | |
| 2013/0020658 A1 | 1/2013 | Guo et al. | |
| 2013/0032859 A1 | 2/2013 | Pei et al. | |
| 2013/0119395 A1 * | 5/2013 | Bhuwalka | H01L 29/7391 257/76 |
| 2013/0175635 A1 | 7/2013 | Kwon et al. | |
| 2014/0175381 A1 * | 6/2014 | Goh | H01L 29/66545 257/39 |
| 2014/0203324 A1 | 7/2014 | Huang et al. | |
| 2015/0011056 A1 | 1/2015 | Kapoor et al. | |
| 2015/0060989 A1 | 3/2015 | Loiko et al. | |
| 2015/0214366 A1 | 7/2015 | Chang et al. | |
| 2015/0255294 A1 | 9/2015 | Leobandung et al. | |
| 2015/0318354 A1 | 11/2015 | Yin et al. | |
| 2016/0322479 A1 | 11/2016 | Liu et al. | |
| 2017/0125556 A1 * | 5/2017 | Gossner | H01L 29/0895 |

FOREIGN PATENT DOCUMENTS

| | | |
|---|---|---|
| CN | 102906879 A | 1/2013 |
| CN | 102945861 A | 2/2013 |
| CN | 103117306 A | 5/2013 |
| CN | 103296079 A | 9/2013 |
| CN | 104332500 A | 2/2015 |
| EP | 2148374 A1 | 1/2010 |

* cited by examiner

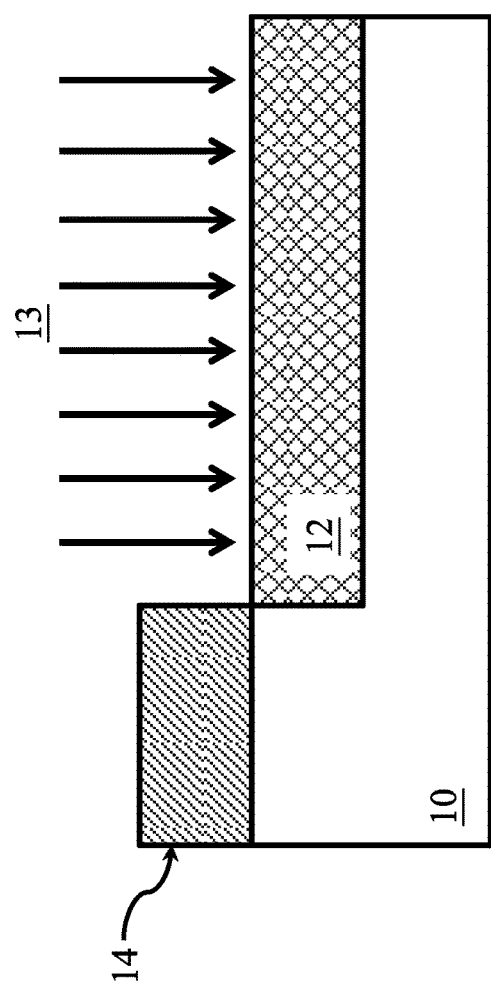
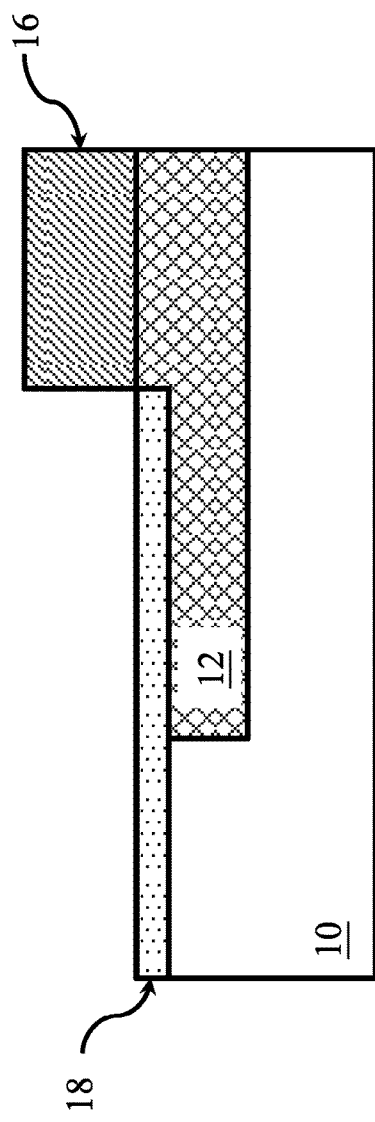
Figure 4A
Figure 4B

STAGGERED-TYPE TUNNELING FIELD EFFECT TRANSISTOR

PRIORITY CLAIM AND CROSS-REFERENCE

This application claims priority to and is a continuation of U.S. patent application Ser. No. 14/700,187, entitled "Staggered-Type Tunneling Field Effect Transistor," filed on Apr. 30, 2015, which application is incorporated herein by reference.

BACKGROUND

The present application relates to the field of Tunneling Field Effect Transistors.

From the invention of the integrated circuit, it has been a goal to make the devices on the integrated circuit smaller and smaller. This provides greater functionality on each integrated circuit. However, with device dimensions reaching the scale of tens of nanometers and operational voltages dropping to tenths of a volt, traditional MOSFETs have reached some physical limits. Thus, other transistor types are being explored.

One type of transistor is the Tunneling Field Effect Transistor (TFET). With this transistor, a tunneling region is modulated by a voltage applied to a gate near the tunneling region. However, operational characteristics of such devices in the art are not currently acceptable for most commercial applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4D are side view diagrams illustrating the process of FIG. 3;

DETAILED DESCRIPTION

Figure 1:
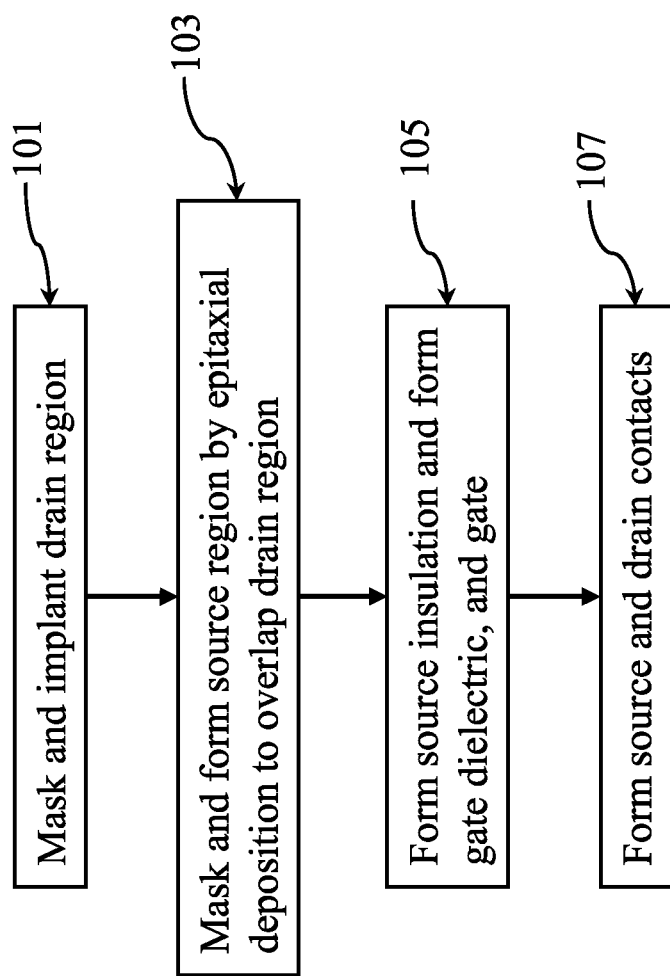
FIG. 1 is a process flow chart for fabricating a TFET, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart showing a process flow according to some embodiments. FIGS. 2A-2D are side view diagrams illustrating the steps of the process of FIG. 1. In step 101, a mask 14 is formed on the surface of substrate 10 using conventional photolithographic techniques. An implantation of dopant ions 13 is then performed and then annealed to form source region 12. The substrate in this example is a crystalline silicon substrate, but may be another semiconductor substrate such as crystalline germanium or a III-V semiconductor. The dopant may be chosen from any known dopant atoms. In this example, source region 12 is doped to a P++ doping level. For example, an implantation having an energy of 20-40 KeV with a dose of 0.1 to $5\times10^{15}$ atoms/cm$^2$ may be performed at a temperature of 1000° C. for about 10 seconds.

Figure 2A:
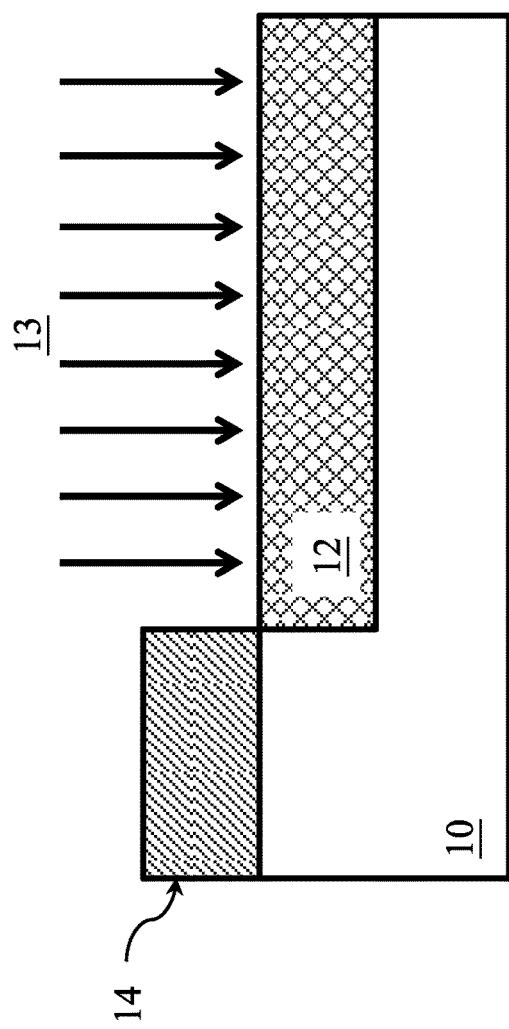
FIGS. 2A-2D are side view diagrams illustrating the process of FIG. 1.
Figure 2B:
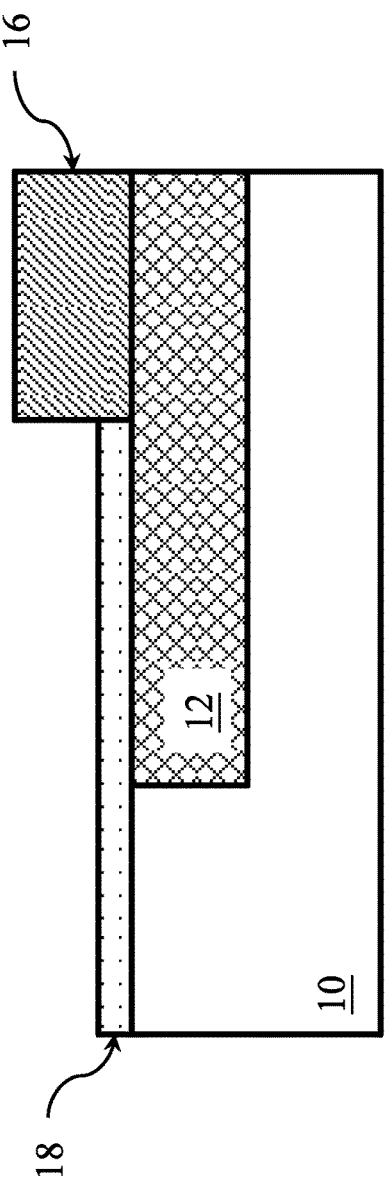

In step 103 and FIG. 2B, a thick oxide layer 16 is formed and patterned as shown in FIG. 2B. Oxide layer 16 may be formed using known chemical vapor deposition techniques or thermally grown. With Oxide layer 16 serving as a mask, drain region 18 is formed using epitaxial deposition techniques, such as Chemical Vapor Deposition (CVD). In this example, drain region 18 is formed of SiGe and the relative concentrations of silicon and germanium are varied during deposition to create a heterojunction with source/drain 12. In some embodiments, drain region 18 may be composed of Si, Ge, SiGe, SiC, GeSn, SiP or III-V semiconductor material. Source region 12 and drain region 18 are designated source and drain, respectively, in the embodiment of FIGS. 2A-D. However, in other embodiments region 12 may serve as a drain region and region 18 may serve as a source. That is, either region may serve as a source or drain depending on selected doping and material composition, and on the configuration of the circuit in which the transistor is used.

Figure 2C:
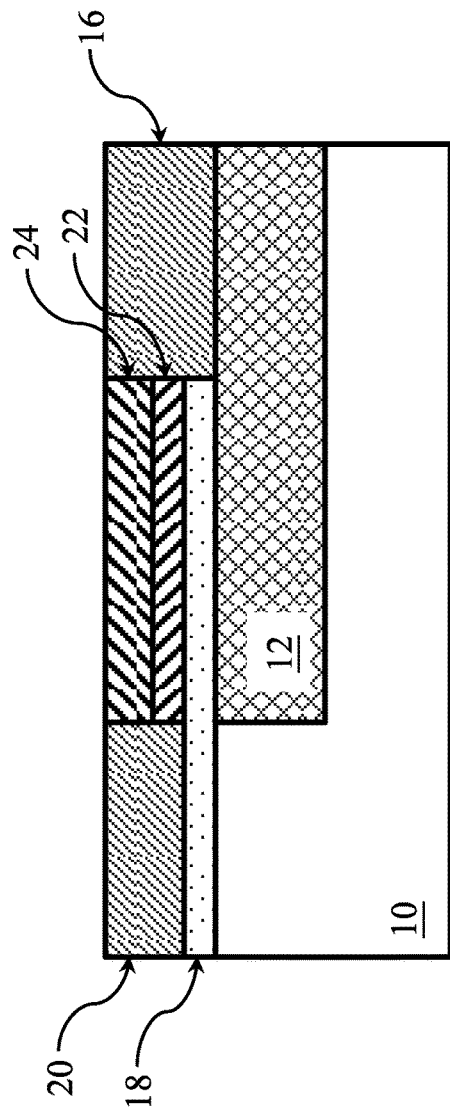

In step 105 and FIG. 2C, a thick oxide layer 20 is formed and patterned as shown in FIG. 2C. In this example, oxide layer 20 is formed by chemical vapor deposition (CVD) techniques and is patterned using standard lithographic techniques. Next, in the opening between oxide layers 16 and 20, a gate dielectric 22 is formed. Gate dielectric 22 is shown only in the bottom of the opening between oxide regions 16 and 20 in FIG. 2C. However, in some embodiments, dielectric layer 22 may also be formed on the sides of oxide regions 16 and 20. In some embodiments, the gate dielectric layer 22 may include silicon oxide, silicon nitride, silicon oxy-nitride, or high dielectric constant (high-k) dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In some embodiments, the gate dielectric layer 22 has a thickness in the range of about 10 angstroms to about 30 angstroms. In this example, gate dielectric is a High K dielectric material that is formed using ALD.

Gate electrode 24 is then formed on gate dielectric 22. Gate electrode 24 may be doped polycrystalline silicon or may comprises a metal selected from a group of W, Cu, Ti, Ag, Al, TiAl, TiAlN, TaC, TaCN, TaSiN, Mn, Zr, TiN, WN, TaN, and Ru or combinations thereof. In some embodiments, the gate electrode layer 24 has a thickness in the range of about 30 nm to about 60 nm. The gate electrode layer 24 may be formed using a suitable process such as ALD, CVD, physical vapor deposition (PVD), plating, or combinations thereof.

Figure 2D:
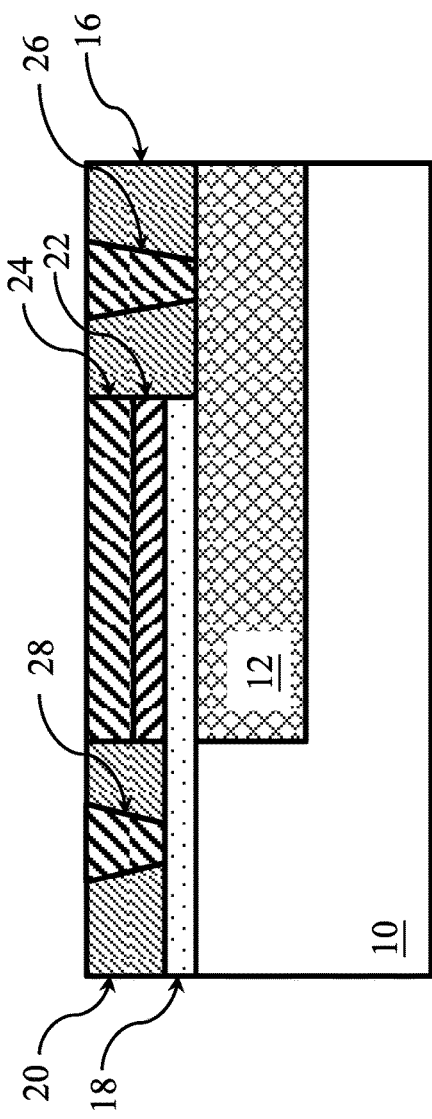

In step 107 and FIG. 2D, source and drain contact openings are formed in oxide layers 16 and 20, respectively. Source contact 26 and drain contact 28 are formed therein. The openings are made using standard photolithographic and etching techniques. In one example, source contact 26 and drain contact 28 include a barrier layer to line the contact openings and a conductive layer deposited afterwards to fill the contact openings. The barrier layer may promote adhesion of the conductive layer. In addition, if the conductive layer is made of diffusive element, such as Cu, the barrier layer blocks diffusion into neighboring layers or structures. In some embodiments, the barrier layer includes Ti, TiN, Ta, TaN, or combinations thereof. The barrier layer may be formed by PVD, ALD, or other applicable processes. In some embodiments, the thickness of layer is in a range from about 1 nm to about 10 nm.

The conductive layer may be made of any conductive metal or metal alloy. Examples of suitable conductive metals include, but are not limited to, Cu, Al, W, Pt, Au, Ag, etc. The conductive layer may be formed by plating, PVD, ALD, or other applicable processes. In some embodiments, the thickness of the conductive layer is in a range from about 100 nm to about 200 nm.

After the contact openings are filled, a planarization process, such as chemical mechanical polishing (CMP) process, is performed to remove the barrier layer and conductive layer outside contact openings to provide the planar structure shown in FIG. 2D.

Figure 3:
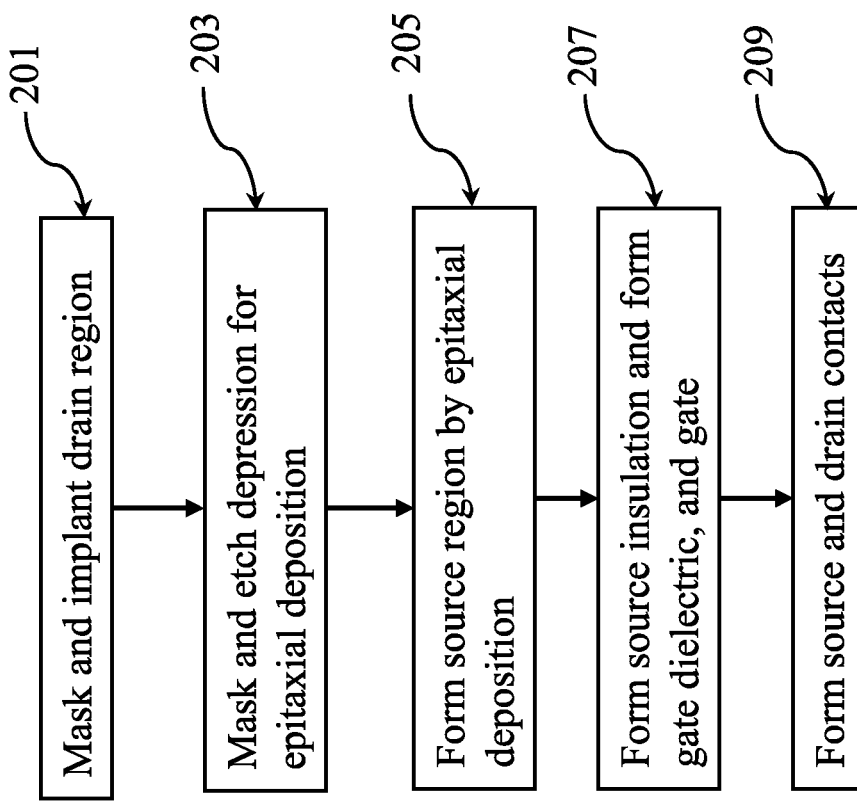
FIG. 3 is another process flow chart for fabricating a TFET, in accordance with some embodiments.

FIG. 3 is another example process flow. FIGS. 4A-4D are side views illustrating the process of FIG. 3. Elements in common with the process of FIGS. 2A-2D bear the same identification number. In step 201, a mask 14 is formed on the surface of substrate 10 using conventional photolithographic techniques. An implantation of dopant ions 13 is then performed and then annealed to form source region 12. The substrate in this example is a crystalline silicon substrate. The dopant may be chosen from any known dopant atoms. In this example, source region 12 is doped to a P++ doping level. For example, an implantation having an energy of 20-40 KeV with a dose of 0.1 to $5 \times 10^{15}$ atoms/cm$^2$ be performed at a temperature of 1000° C. for about 10 seconds.

In step 203 and FIG. 4B, a thick oxide layer 16 is formed and patterned as shown in FIG. 4B. Oxide layer 16 may be formed using known chemical vapor deposition techniques or thermally grown. With oxide layer 16 serving as a mask, a portion of substrate 10 is removed using common etching techniques. The etch process may be reactive ion etch using SF6, SiCl4, C4F8, CH4, H2 or other known etch gases. It is preferred that the etch process parameters be selected to provide an etch that is as anisotropic as is practicable. In step 205, the drain region 18 then is formed using epitaxial deposition techniques, such as ALD. In this example, drain region 18 is formed of SiGe and the relative concentrations of silicon and germanium are varied during deposition to create a heterojunction with source 12. In some embodiments, drain region 18 may be composed of Si, Ge, SiGe, SiC, GeSn, SiP or III-V semiconductor material. By etching the substrate 10, the top of drain region 18 is then roughly even with the top of substrate 10. This relative planarity aids in subsequent production steps.

Figure 4C:
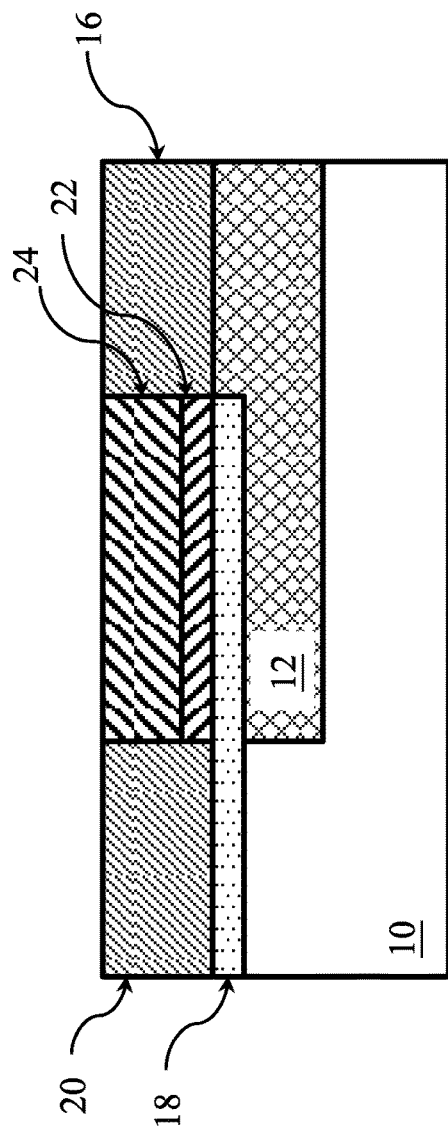

In step 207 and FIG. 4C, a thick oxide layer 20 is formed and patterned as shown in FIG. 4C. In this example, oxide layer 20 is formed by chemical vapor deposition (CVD) techniques and is patterned using standard lithographic techniques. Next, in the opening between oxide layers 16 and 20, a gate dielectric layer 22 is formed. In some embodiments, the gate dielectric layer 22 may include silicon oxide, silicon nitride, silicon oxy-nitride, or high dielectric constant (high-k) dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In some embodiments, the gate dielectric layer 22 has a thickness in the range of about 10 angstroms to about 30 angstroms. In this example, gate dielectric is a High K dielectric material that is formed using ALD.

Gate electrode 24 is then formed on gate dielectric 22. Gate electrode 24 may be doped polycrystalline silicon or may comprise a metal selected from a group of W, Cu, Ti, Ag, Al, TiAl, TiAlN, TaC, TaCN, TaSiN, Mn, Zr, TiN, WN, TaN, and Ru or combinations thereof. In some embodiments, the gate electrode layer 24 has a thickness in the range of about 30 nm to about 60 nm. The gate electrode layer 24 may be formed using a suitable process such as ALD, CVD, PVD, plating, or combinations thereof.

Figure 4D:
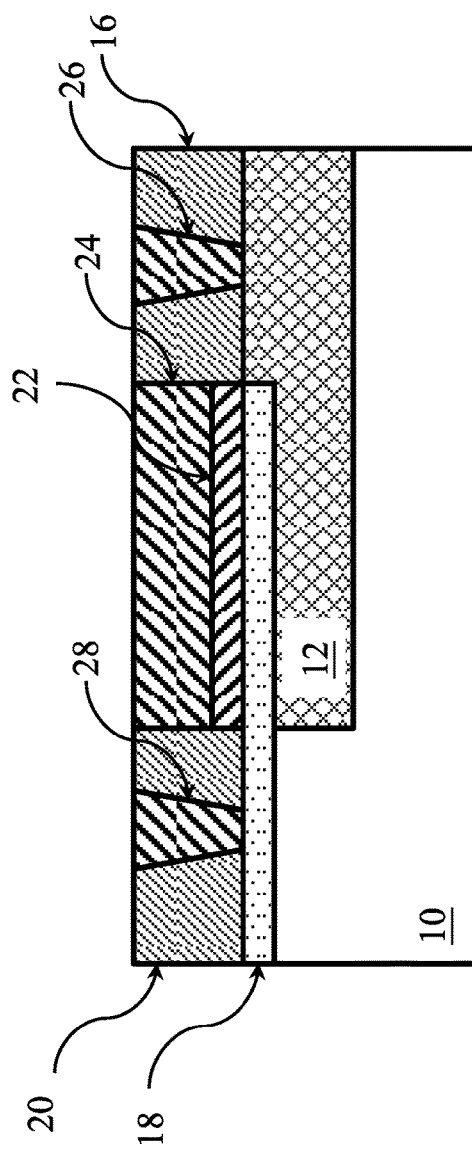

In step 209 and FIG. 4D, source and drain contact openings are formed in oxide layers 16 and 20, respectively. Source contact 26 and drain contact 28 are formed therein. The openings are made using standard photolithographic and etching techniques. In one example, source contact 26 and drain contact 28 include a barrier layer to line the contact openings and a conductive layer deposited afterwards to fill the contact openings. The barrier layer may promote adhesion of the conductive layer. In addition, if the conductive layer is made of a diffusive element, such as Cu, the barrier layer blocks diffusion into neighboring layers or structures. In some embodiments, the barrier layer includes Ti, TiN, Ta, TaN, or combinations thereof. The barrier layer may be formed by PVD, ALD, or other applicable processes. In some embodiments, the thickness of layer is in a range from about 1 nm to about 10 nm.

The conductive layer may be made of any conductive metal or metal alloy. Examples of suitable conductive metals include, but are not limited to, Cu, Al, W, Pt, Au, Ag, etc. The conductive layer may be formed by plating, PVD, ALD, or other applicable processes. In some embodiments, the thickness of the conductive layer is in a range from about 100 nm to about 200 nm.

After the contact openings are filled, a planarization process, such as chemical mechanical polishing (CMP), is performed to remove the barrier layer and conductive layer outside contact openings to provide the planar structure shown in FIG. 4D.

Figure 5:
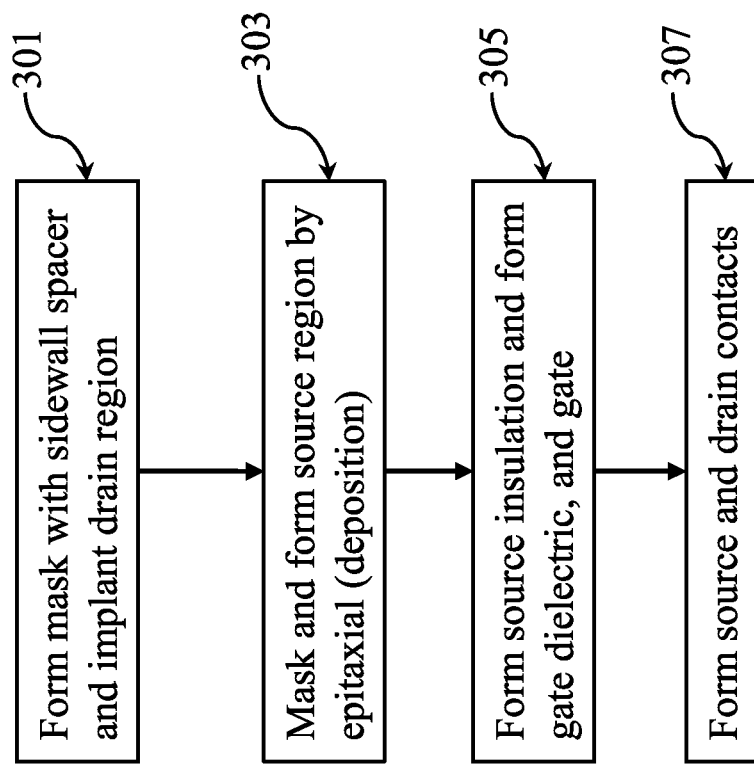
FIG. 5 is another process flow chart for fabricating a TFET, in accordance with some embodiments.

FIG. 5 is another example process flow. FIGS. 6A-6D are side views illustrating the process of FIG. 5. Elements in common with the process of FIGS. 4A-4D bear the same identification number. In step 301, a mask 14 is formed on the surface of substrate 10 using conventional photolithographic techniques. In addition, a sidewall spacer 15 is formed by depositing a layer and etching the layer anisotropically using a process such as RIE. The composition of the layer is not critical as the sidewall spacer 15 is subsequently removed. Exemplary materials may be silicon dioxide, silicon nitride or polyimide. An implantation of dopant ions 13 is then performed and then annealed to form source region 12. The substrate in this example is a crystalline silicon substrate. The dopant may be chosen from any known dopant atoms. In this example, source region 12 is doped to a P++ doping level. For example, an implantation having an energy of 20-40 KeV with a dose of 0.1 to $5\times10^{15}$ atoms/cm$^2$ may be performed at a temperature of 1000° C. for about 10 seconds.

Figure 6A:
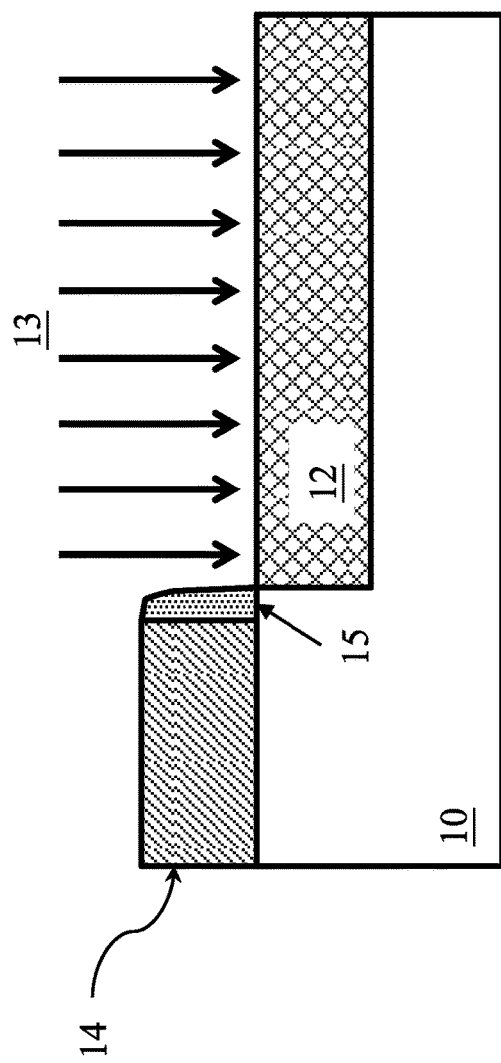
FIGS. 6A-6D are side view diagrams illustrating the process of FIG. 5.
Figure 6B:
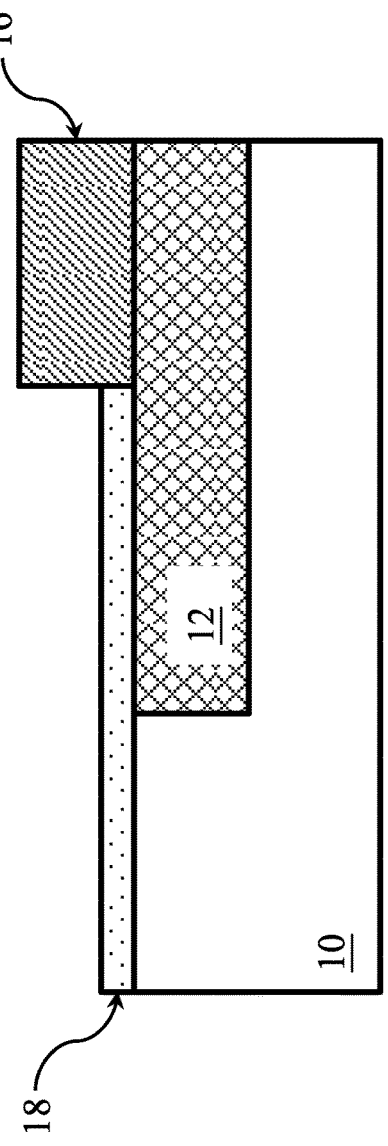

In step 303 and FIG. 6B, a thick oxide layer 16 is formed and patterned as shown in FIG. 6B. Oxide layer 16 may be formed using known chemical vapor deposition techniques or thermally grown. With Oxide layer 16 serving as a mask, drain region 18 then is formed using epitaxial deposition techniques, such as ALD. In this example, drain region 18 is formed of SiGe and the relative concentrations of silicon and germanium are varied during deposition to create a heterojunction with source 12. In some embodiments, drain region 18 may be composed of Si, Ge, SiGe, SiC, SiP or III-V semiconductor material.

Figure 6C:
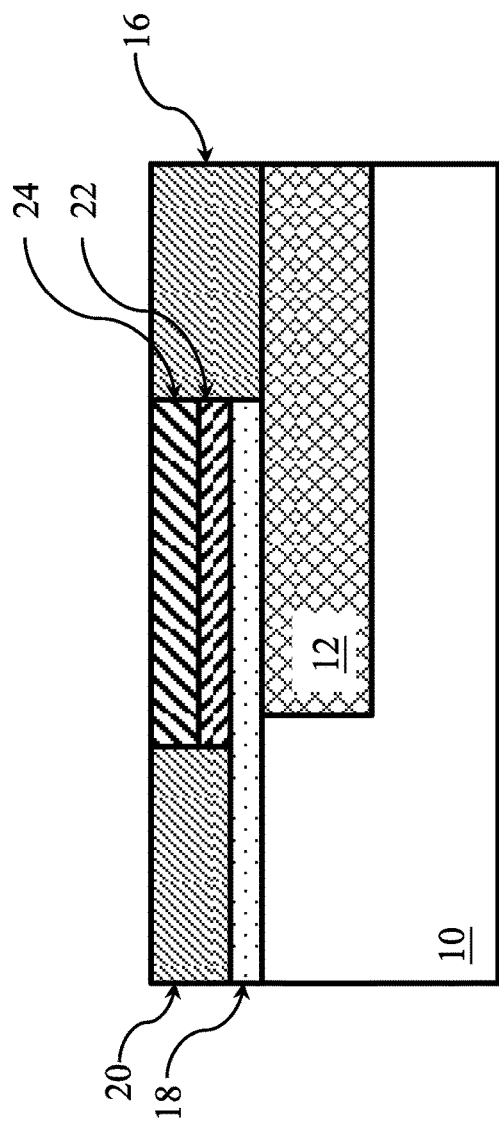

In step 305 and FIG. 6C, a thick oxide layer 20 is formed and patterned as shown in FIG. 6C. In this example, oxide layer 20 is formed by chemical vapor deposition (CVD) techniques and is patterned using standard lithographic techniques. Next, in the opening between oxide layers 16 and 20, a gate dielectric 22 is formed. In some embodiments, the gate dielectric layer 22 may include silicon oxide, silicon nitride, silicon oxy-nitride, or high dielectric constant (high-k) dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. Gate oxide layer 22 is shown only in the bottom of the gap between oxide layers 16 and 20 in FIG. 6C. However, gate oxide layer may also extend to the sides of oxide layers 16 and 20. In some embodiments, the gate dielectric layer 22 has a thickness in the range of about 10 angstroms to about 30 angstroms. In this example, gate dielectric is a High K dielectric material that is formed using atomic layer deposition (ALD).

Gate electrode 24 is then formed on gate dielectric 22. Gate electrode 24 may be doped polycrystalline silicon or may comprises a metal selected from a group of W, Cu, Ti, Ag, Al, TiAl, TiAlN, TaC, TaCN, TaSiN, Mn, Zr, TiN, WN, TaN, and Ru or combinations thereof. In some embodiments, the gate electrode layer 24 has a thickness in the range of about 30 nm to about 60 nm. The gate electrode layer 24 may be formed using a suitable process such as ALD, CVD, PVD, plating, or combinations thereof.

Figure 6D:
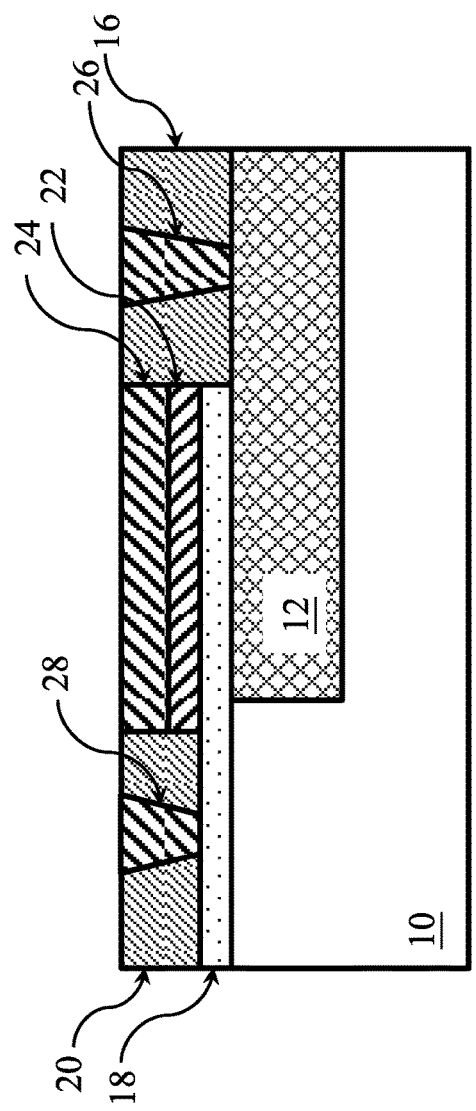

In step 307 and FIG. 6D, source and drain contact openings are formed in oxide layers 16 and 20, respectively. Source contact 26 and drain contact 28 are formed therein. The openings are made using standard photolithographic and etching techniques. In one example, source contact 26 and drain contact 28 include a barrier layer to line the contact openings and a conductive layer deposited afterwards to fill the contact openings. The barrier layer may promote adhesion of the conductive layer. In addition, if the conductive layer is made of diffusive element, such as Cu, the barrier layer blocks diffusion into neighboring layers or structures. In some embodiments, the barrier layer includes Ti, TiN, Ta, TaN, or combinations thereof. The barrier layer may be formed by PVD, ALD, or other applicable processes. In some embodiments, the thickness of layer is in a range from about 1 nm to about 10 nm.

The conductive layer may be made of any conductive metal or metal alloy. Examples of suitable conductive metals include, but are not limited to, Cu, Al, W, Pt, Au, Ag, etc. The conductive layer may be formed by plating, PVD, ALD, or other applicable processes. In some embodiments, the thickness of the conductive layer is in a range from about 100 nm to about 200 nm.

After the contact openings are filled, a planarization process, such as a CMP, is performed to remove the barrier layer and conductive layer outside contact openings to provide the planar structure shown in FIG. 6D. By offsetting source 12 from the edge of gate 24, a more uniform electric field is applied to all of the junction between the source 12 and drain 18, thus providing better tunneling behavior in response to an applied gate voltage.

Figure 7:
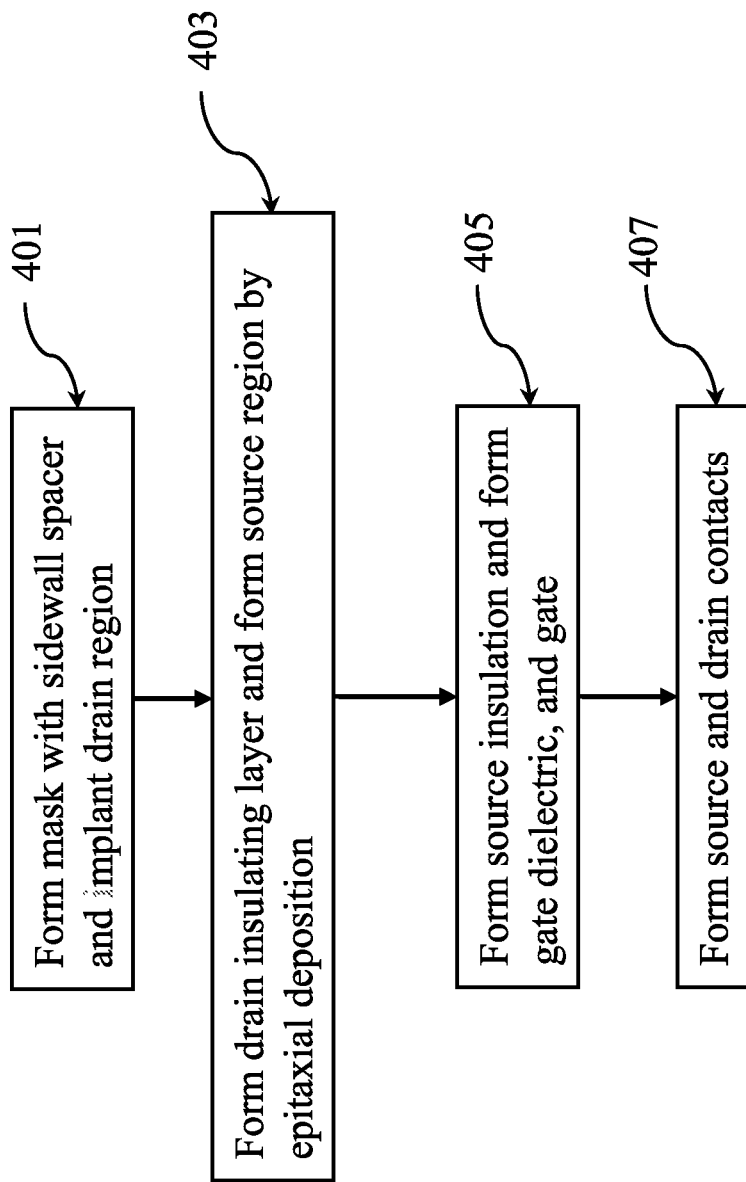
FIG. 7 is another process flow chart for fabricating a TFET, in accordance with some embodiments.

FIG. 7 is another example process flow. FIGS. 8A-D are side views illustrating the process of FIG. 7. Elements in common with the process of FIGS. 6A-6D bear the same identification number. In step 401, a mask 14 is formed on the surface of substrate 10 using conventional photolithographic techniques. In addition, a sidewall spacer 15 is formed by depositing a layer and etching the layer anisotropically using a process such as RIE. An implantation of dopant ions 13 is then performed and then annealed to form source region 12. The substrate in this example is a crystalline silicon substrate. The dopant may be chosen from any known dopant atoms. In this example, source region 12 is doped to a P++ doping level. For example, an implantation having an energy of 20-40 KeV with a dose of 0.1 to $5\times10^{15}$ atoms/cm$^2$ be performed at a temperature of 1000° C. for about 10 seconds.

Figure 8A:
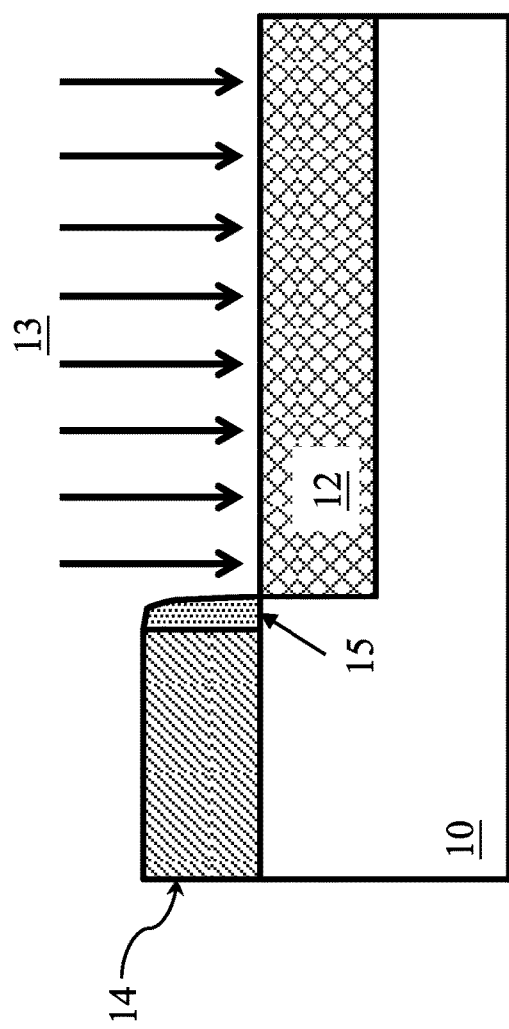
FIGS. 8A-8D are side view diagrams illustrating the process of FIG. 7.
Figure 8B:
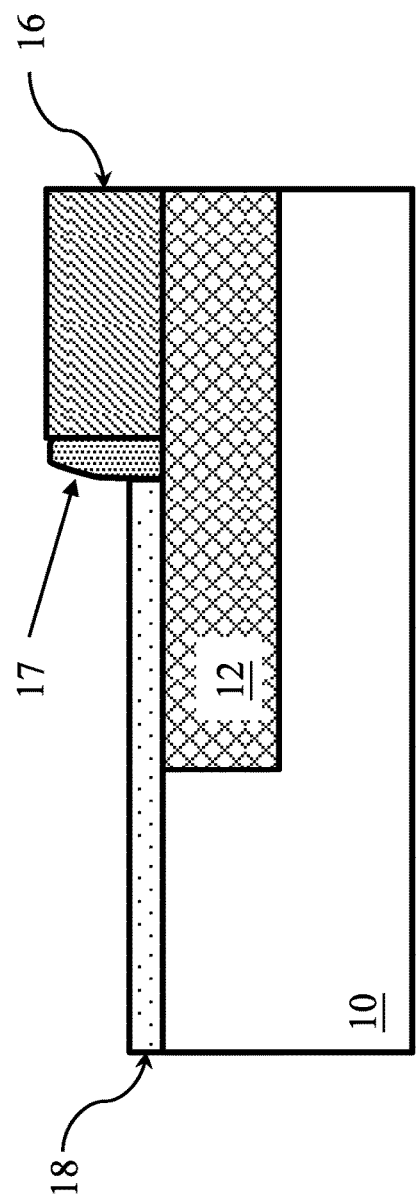

In step 403 and FIG. 8B, a thick oxide layer 16 is formed and patterned as shown in FIG. 8B. Oxide layer 16 may be formed using known chemical vapor deposition techniques or thermally grown. Sidewall spacer 17 is formed by depositing a layer of, for example, silicon dioxide deposited using CVD and then anisotropically etching the deposited layer. With Oxide layer 16 and sidewall spacer 17 serving as a mask, drain region 18 then is formed using epitaxial deposition techniques, such as ALD. In this example, drain region 18 is formed of SiGe and the relative concentrations of silicon and germanium are varied during deposition to create a heterojunction with source 12. In some embodiments, drain region 18 may be composed of Si, Ge, SiGe, SiC, GeSn, SiP or III-V semiconductor material.

Figure 8C:
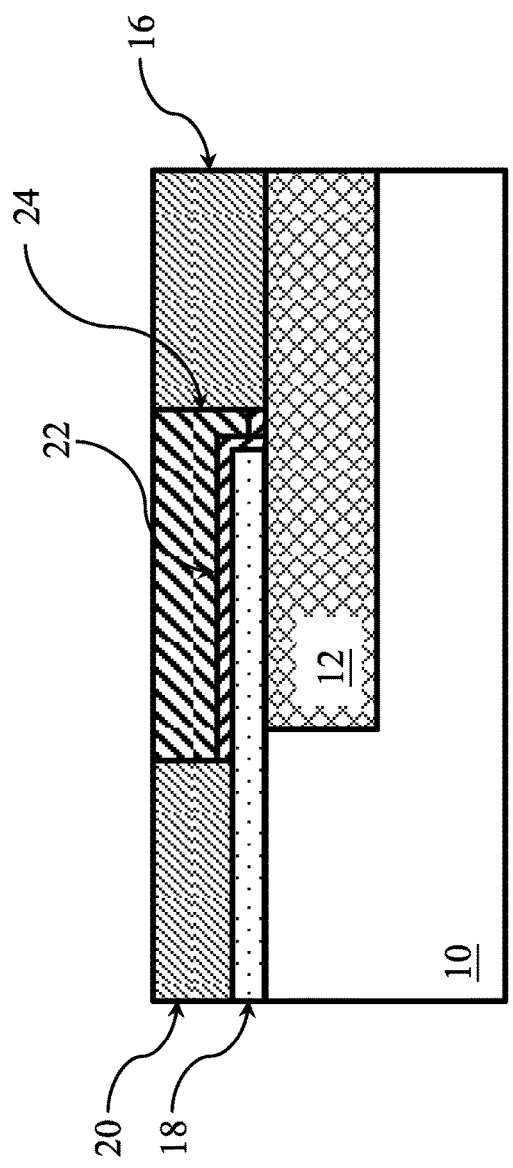

In step 405 and FIG. 8C, a thick oxide layer 20 is formed and patterned as shown in FIG. 8C. In this example, oxide layer 20 is formed by chemical vapor deposition (CVD) techniques and is patterned using standard lithographic techniques. Next, in the opening between oxide layers 16 and 20, a gate dielectric 22 is formed. In some embodiments, the gate dielectric layer 22 may include silicon oxide, silicon nitride, silicon oxy-nitride, or high dielectric constant (high-k) dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In some embodiments, the gate dielectric layer 22 has a thickness in the range of about 10 angstroms to about 30 angstroms. In this example, gate dielectric is a High K dielectric material that is formed using atomic layer deposition (ALD).

Gate electrode 24 is then formed on gate dielectric 22. Gate electrode 24 may be doped polycrystalline silicon or may comprises a metal selected from a group of W, Cu, Ti, Ag, Al, TiAl, TiAlN, TaC, TaCN, TaSiN, Mn, Zr, TiN, WN, TaN, and Ru or combinations thereof. In some embodiments, the gate electrode layer 24 has a thickness in the range of about 30 nm to about 60 nm. The gate electrode layer 24 may be formed using a suitable process such as ALD, CVD, physical vapor deposition (PVD), plating, or combinations thereof. Because gate electrode 24 extends beyond the tunneling interface area between source region 12 and drain region 18, a more uniform electric field can be applied to this tunneling interface, thus improving performance.

Figure 8D:
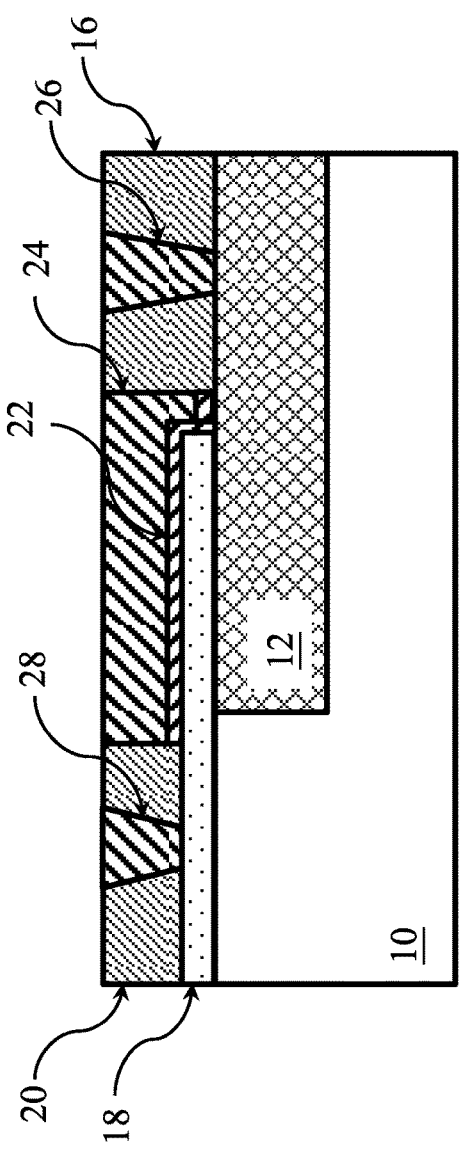

In step 407 and FIG. 8D, source and drain contact openings are formed in oxide layers 16 and 20, respectively. Source contact 26 and drain contact 28 are formed therein. The openings are made using standard photolithographic and etching techniques. In one example, source contact 26 and drain contact 28 include a barrier layer to line the contact openings and a conductive layer deposited afterwards to fill the contact openings. The barrier layer may promote adhesion of the conductive layer. In addition, if the conductive layer is made of diffusive element, such as Cu, the barrier layer blocks diffusion into neighboring layers or structures. In some embodiments, the barrier layer includes Ti, TiN, Ta, TaN, or combinations thereof. The barrier layer may be formed by PVD, ALD, or other applicable processes. In some embodiments, the thickness of layer is in a range from about 1 nm to about 10 nm.

The conductive layer may be made of any conductive metal or metal alloy. Examples of suitable conductive metals include, but are not limited to, Cu, Al, W, Pt, Au, Ag, etc. The conductive layer may be formed by plating, PVD, ALD, or other applicable processes. In some embodiments, the thickness of the conductive layer is in a range from about 100 nm to about 200 nm.

After the contact openings are filled, a planarization process, such as CMP, is performed to remove the barrier layer and conductive layer outside contact openings to provide the planar structure shown in FIG. 8D. By offsetting source 12 and drain 18 from the edge of gate 24, a more uniform electric field is applied to all of the tunneling junction between the source 12 and drain 18, thus providing better tunneling behavior in response to an applied gate voltage.

Figure 9:
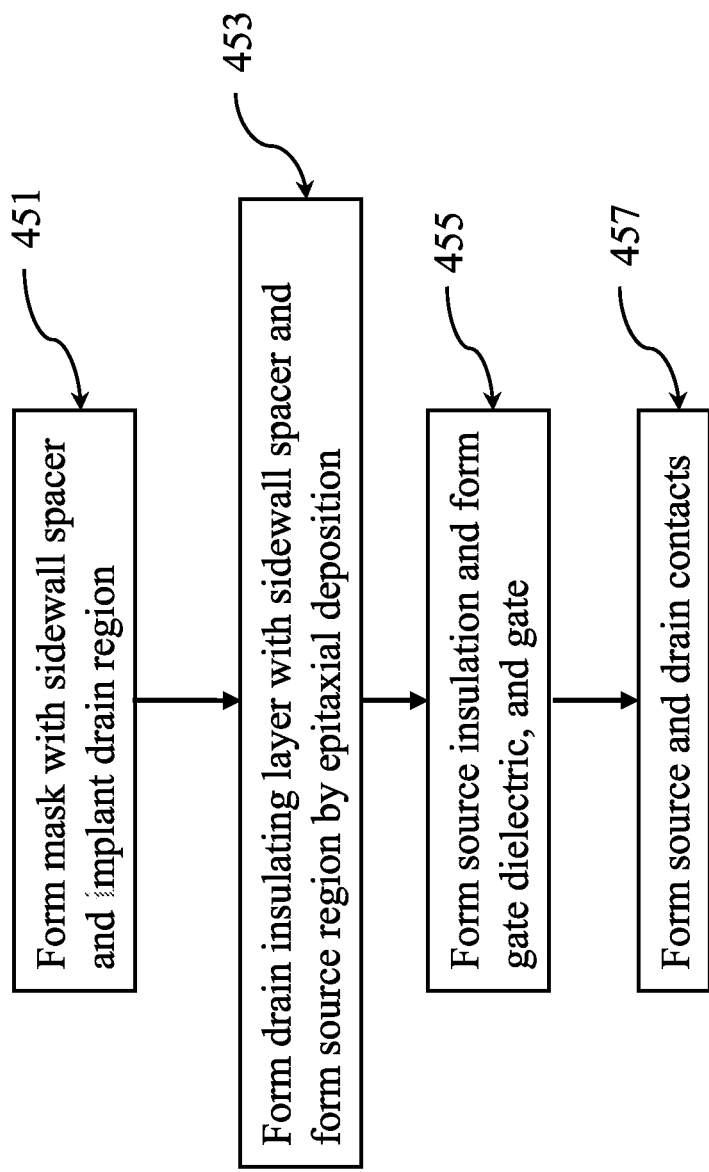
FIG. 9 is another process flow chart for fabricating a TFET, in accordance with some embodiments.

FIG. 9 is another example process flow. FIGS. 10A-D are side views illustrating the process of FIG. 9. Elements in common with the process of FIGS. 8A-8D bear the same identification number In step 451, a mask 14 is formed on the surface of substrate 10 using conventional photolithographic techniques. In addition, a sidewall spacer 15 is formed by depositing a layer and etching the layer anisotropically using a process such as RIE. An implantation of dopant ions 13 is then performed and then annealed to form source region 12. The substrate in this example is a crystalline silicon substrate. The dopant may be chosen from any known dopant atoms. In this example, source region 12 is doped to a P++ doping level. For example, an implantation having an energy of 20-40 KeV with a dose of 0.1 to $5 \times 10^{15}$ atoms/cm$^2$ be performed at a temperature of 1000° C. for about 10 seconds.

Figure 10A:
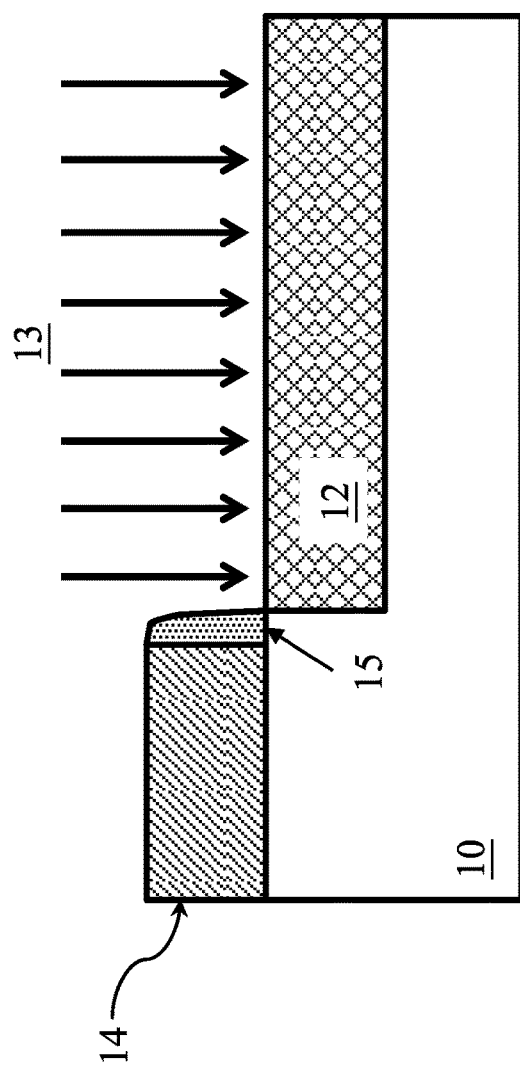
FIGS. 10A-10D are side view diagrams illustrating a modification of the process of FIG. 7.
Figure 10B:
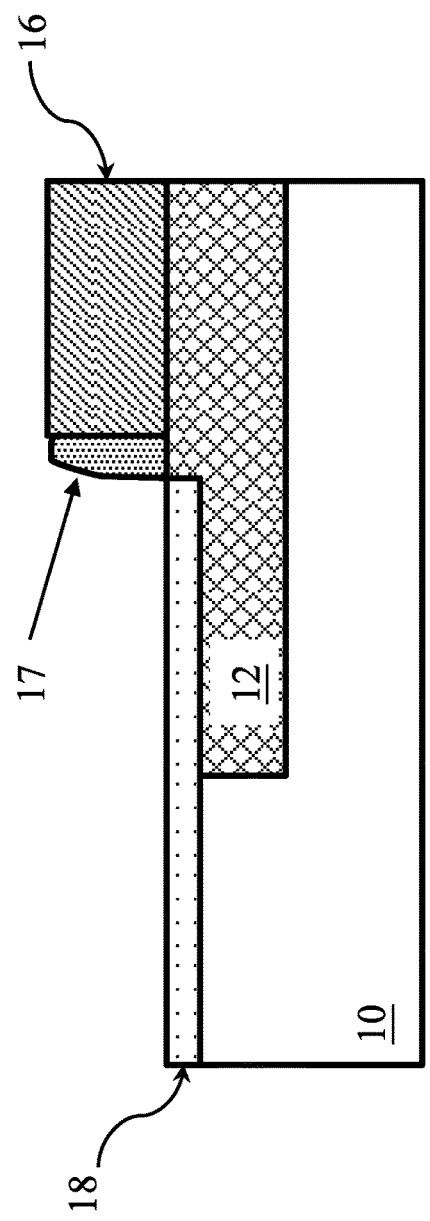

In step 453 and FIG. 10B, a thick oxide layer 16 is formed and patterned as shown in FIG. 10B. Oxide layer 16 may be formed using known chemical vapor deposition techniques or thermally grown. In addition, a sidewall spacer 17 is formed by depositing a layer and etching the layer anisotropically using a process such as RIE. With Oxide layer 16 and sidewall spacer 17 serving as a mask, drain region 18 then is formed using epitaxial deposition techniques, such as ALD. In this example, drain region 18 is formed of SiGe and the relative concentrations of silicon and germanium are varied during deposition to create a heterojunction with source 12. In some embodiments, drain region 18 may be composed of Si, Ge, SiGe, SiC, SiP or III-V semiconductor material.

Figure 10C:
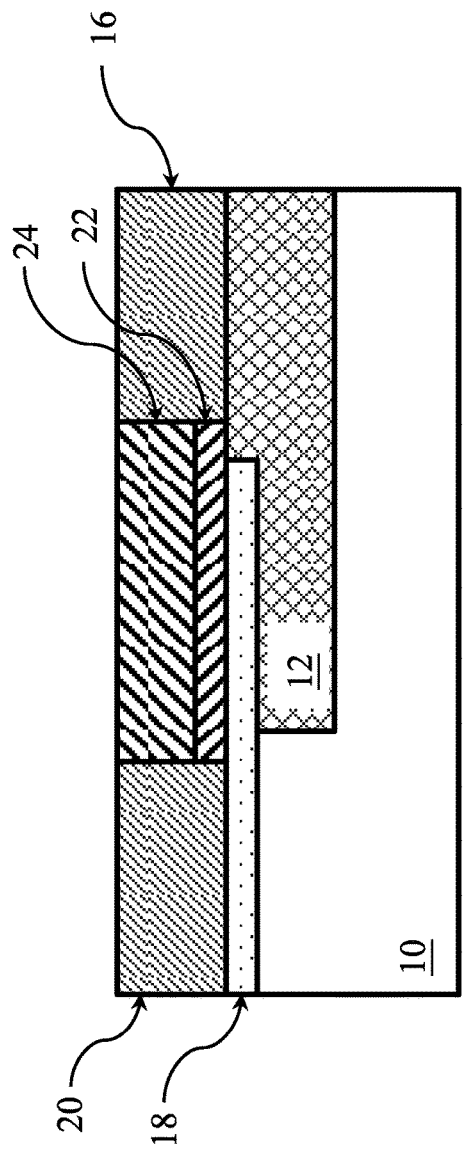

In step 455 and FIG. 10C, a thick oxide layer 20 is formed and patterned as shown in FIG. 10C. In this example, oxide layer 20 is formed by chemical vapor deposition (CVD) techniques and is patterned using standard lithographic techniques. Next, in the opening between oxide layers 16 and 20, a gate dielectric 22 is formed. In some embodiments, the gate dielectric layer 22 may include silicon oxide, silicon nitride, silicon oxy-nitride, or high dielectric constant (high-k) dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In some embodiments, the gate dielectric layer 22 has a thickness in the range of about 10 angstroms to about 30 angstroms. In this example, gate dielectric is a High K dielectric material that is formed using atomic layer deposition (ALD).

Gate electrode 24 is then formed on gate dielectric 22. Gate electrode 24 may be doped polycrystalline silicon or may comprises a metal selected from a group of W, Cu, Ti, Ag, Al, TiAl, TiAlN, TaC, TaCN, TaSiN, Mn, Zr, TiN, WN, TaN, and Ru or combinations thereof. In some embodiments, the gate electrode layer 24 has a thickness in the range of about 30 nm to about 60 nm. The gate electrode layer 24 may be formed using a suitable process such as ALD, CVD, physical vapor deposition (PVD), plating, or combinations thereof.

Figure 10D:
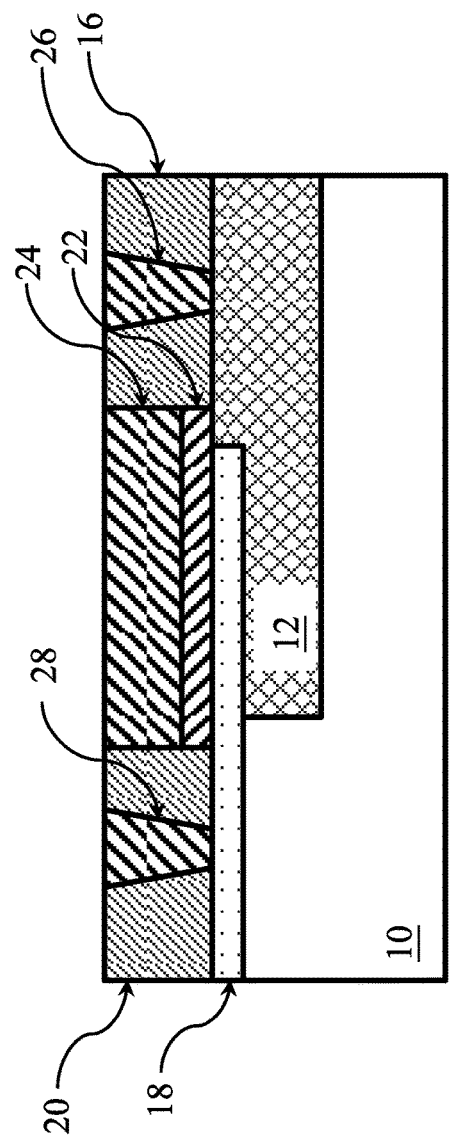

In step 457 and FIG. 10D, source and drain contact openings are formed in oxide layers 16 and 20, respectively. Source contact 26 and drain contact 28 are formed therein. The openings are made using standard photolithographic and etching techniques. In one example, source contact 26 and drain contact 28 include a barrier layer to line the contact openings and a conductive layer deposited afterwards to fill the contact openings. The barrier layer may promote adhesion of the conductive layer. In addition, if the conductive layer is made of diffusive element, such as Cu, the barrier layer blocks diffusion into neighboring layers or structures. In some embodiments, the barrier layer includes Ti, TiN, Ta, TaN, or combinations thereof. The barrier layer may be formed by PVD, ALD, or other applicable processes. In some embodiments, the thickness of layer is in a range from about 1 nm to about 10 nm.

The conductive layer may be made of any conductive metal or metal alloy. Examples of suitable conductive metals include, but are not limited to, Cu, Al, W, Pt, Au, Ag, etc. The conductive layer may be formed by plating, PVD, ALD, or other applicable processes. In some embodiments, the thickness of the conductive layer is in a range from about 100 nm to about 200 nm.

After the contact openings are filled, a planarization process, such as CMP, is performed to remove the barrier layer and conductive layer outside contact openings to provide the planar structure shown in FIG. 8D. By offsetting source 12 and drain 18 from the edge of gate 24, a more uniform electric field is applied to all of the tunneling junction between the source 12 and drain 18, thus providing better tunneling behavior in response to an applied gate voltage.

Figure 11:
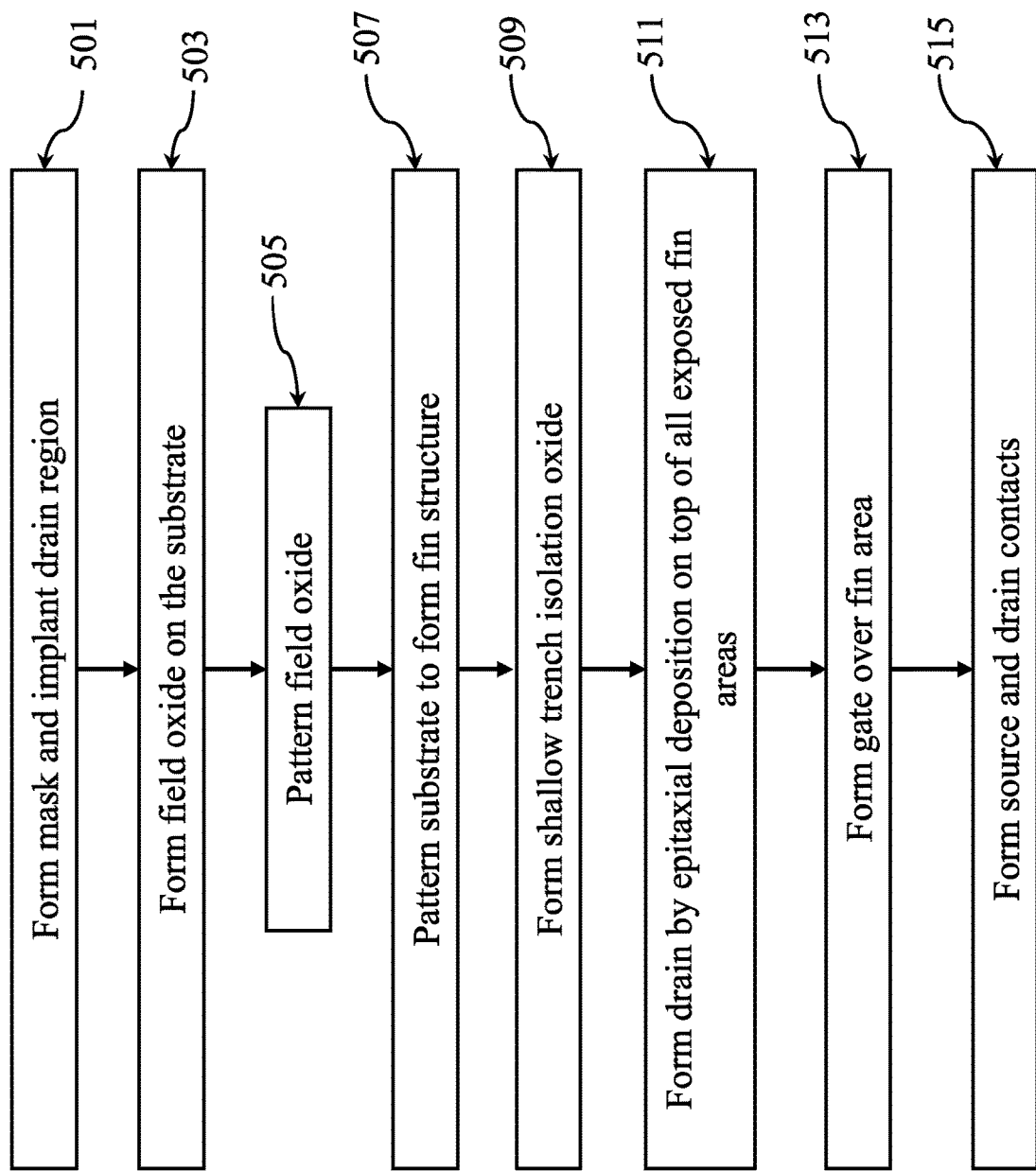
FIG. 11 is a process flow chart for fabricating a TFET, in accordance with some embodiments.
Figure 12A:
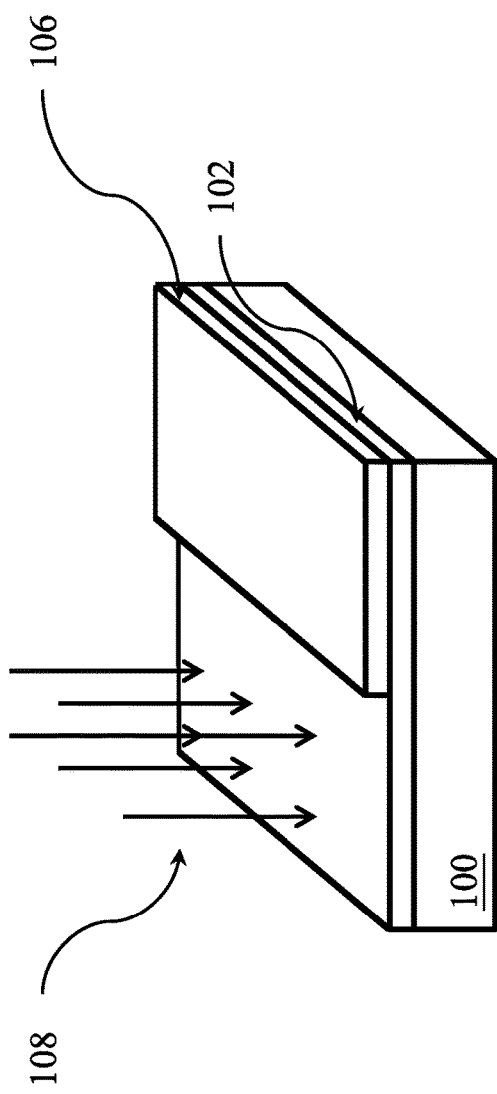
FIGS. 12A-12I are side view diagrams illustrating a modification of the process of FIG. 11.
Figure 12B:
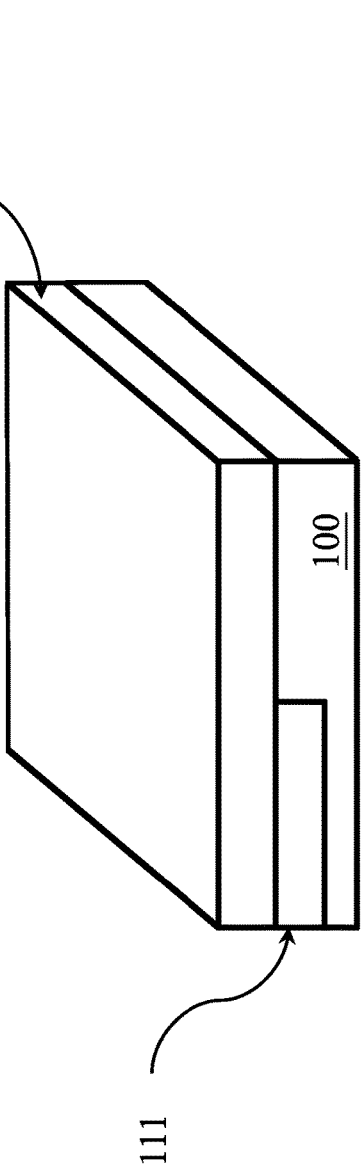

FIG. 11 is a process flow for TFET having a fin-shaped structure, which is an example. FIGS. 12A-12H are side views of the process shown in FIG. 11. In step 501 and FIG. 12A, a sacrificial oxide 102 is grown on the surface of substrate 100, which, in this example, is a crystalline silicon substrate. A masking layer 106 is then deposited and patterned using standard photolithographic techniques. Using the masking layer 106, an implantation 108 is performed to form source region 111 as shown in FIG. 12B. The dopant may be chosen from any known dopant atoms. In this example, source region 12 is doped to a P++ doping level. For example, an implantation having an energy of 20-40 KeV with a dose of 0.1 to $5 \times 10^{15}$ atoms/cm$^2$ be performed at a temperature of 1000° C. for about 10 seconds. Masking layer 106 is then removed.

Figure 12C:
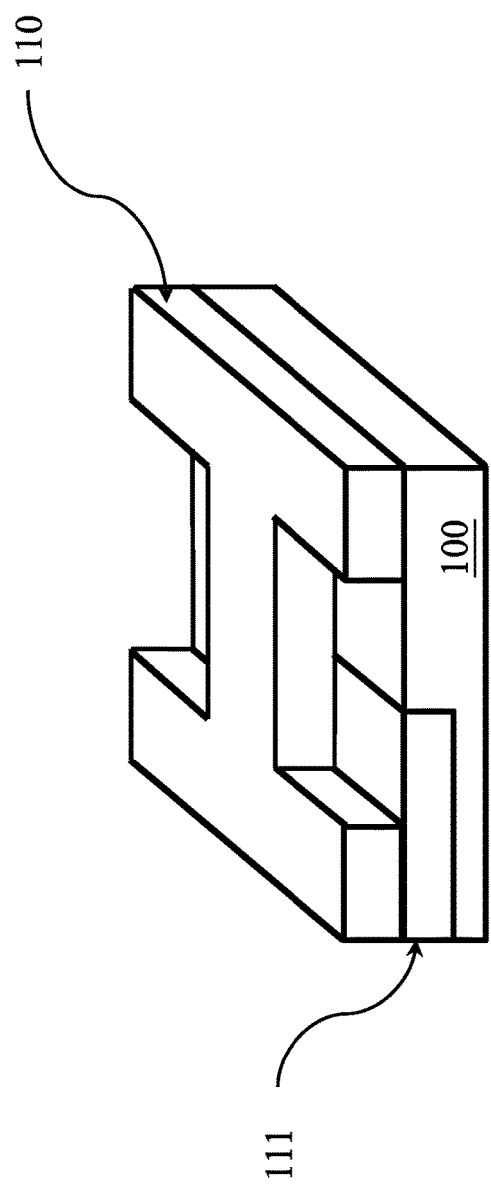
Figure 12D:
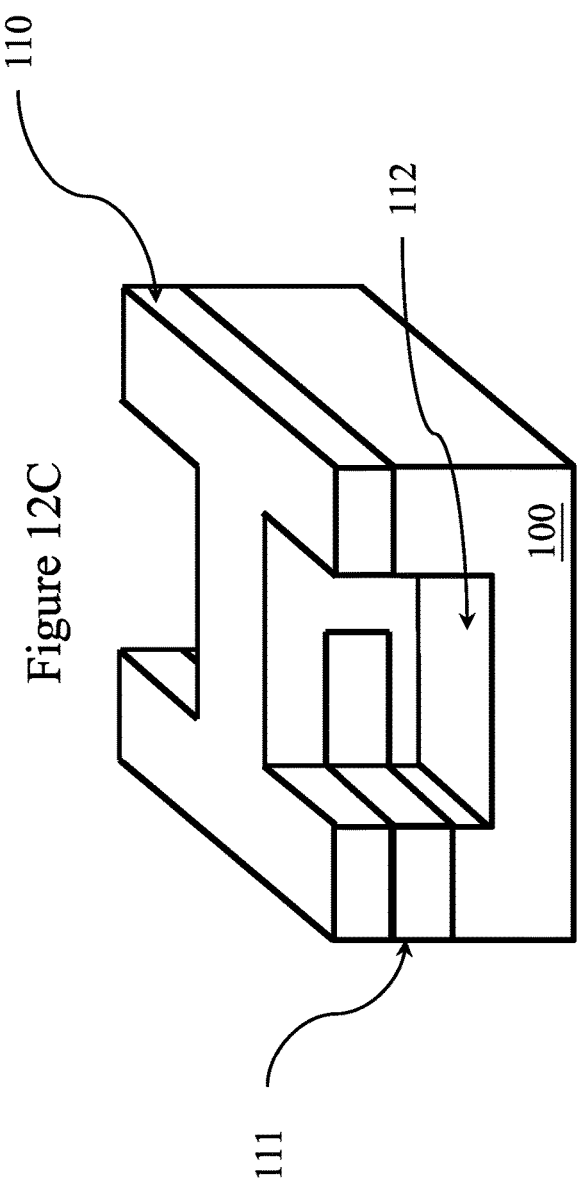

In step 503 shown in FIG. 12B, a thick oxide 110 is formed on the surface of substrate 100. Oxide layer 110 is, for example, formed to a thickness of 100 nm using, for example, plasma enhanced chemical vapor deposition (PECVD). In step 505, thick oxide 110 is then patterned as shown in FIG. 12C. The central part of the pattern defines where the fin will be, and is, for example 100-150 nm long and 50-70 nm wide. In step 507, using patterned thick oxide layer 110 as a mask, openings 112 are etched into substrate 100 using, for example, RIE.

Figure 12E:
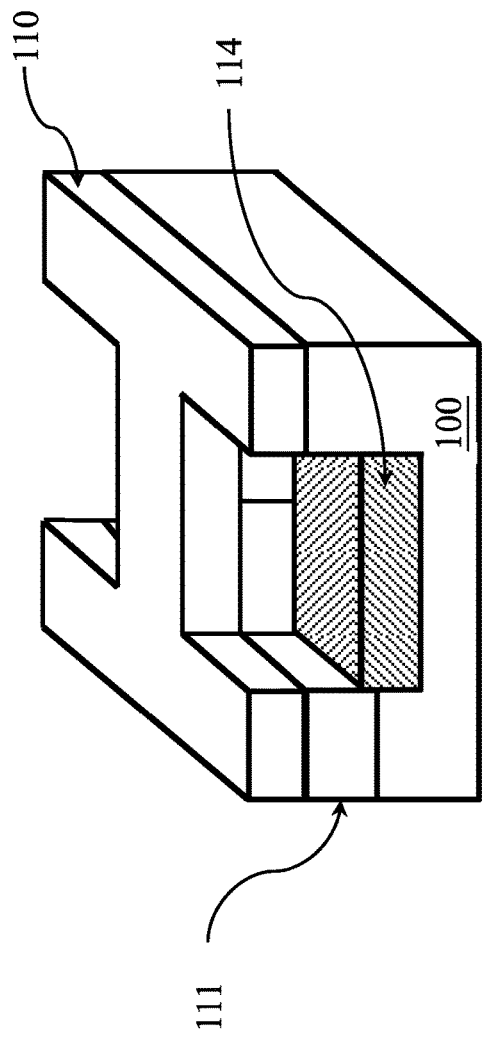
Figure 12F:
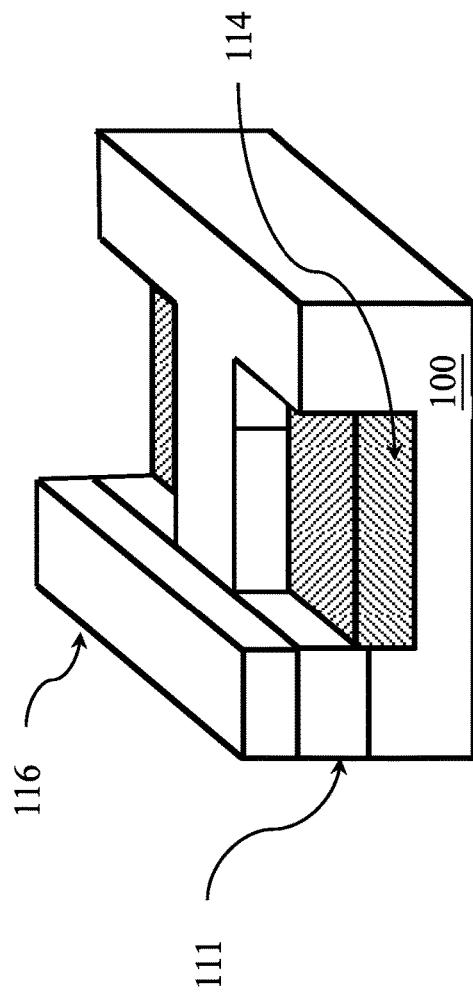

In step 509, isolation oxide regions 114 are formed in the bottoms of openings 112 as shown in FIG. 12E using conventional techniques for forming shallow trench isolation. The top of isolation oxide regions 114 is below the top of drain layer 118 to allow the gate stack 120 (described below) to modulate as much of the source/drain tunneling interface as possible, thus maximizing the source to drain current. Then, oxide layer 110 is patterned and etched so that a portion of oxide layer 110 over what will be the gate and drain regions is removed leaving a cap 116 as shown in FIG. 12F on a portion of the source region 111 where a contact will be formed.

Figure 12G:
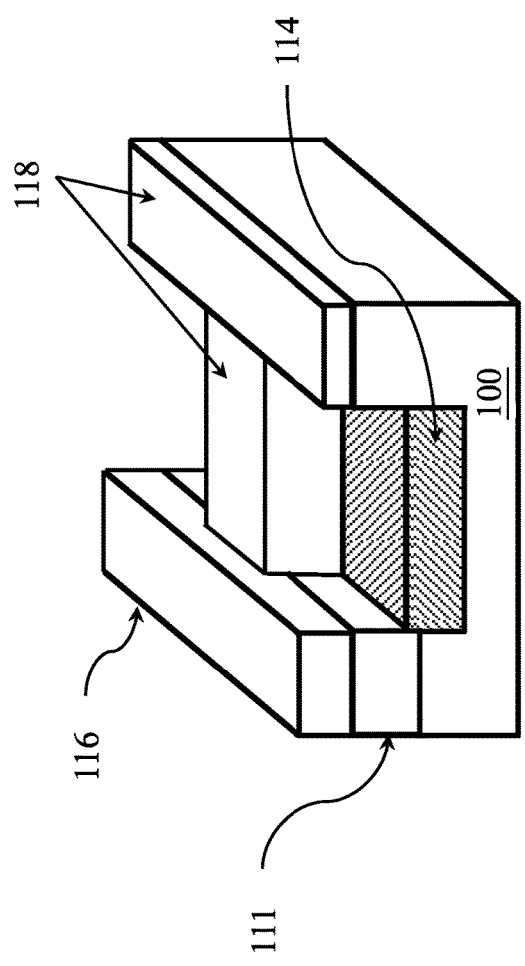
Figure 12H:
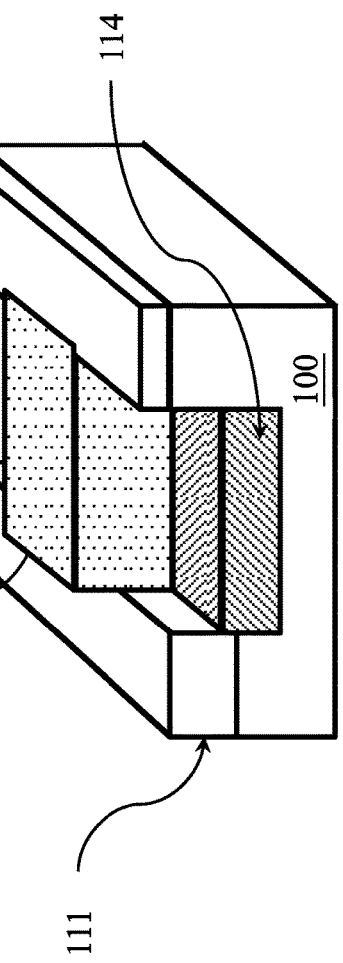

In step 511, a selective epitaxial growth process such as ALD is used to form a drain layer 118 on the exposed surfaces of substrate 110 as shown in FIG. 12G. In this example, drain layer 118 comprises SiGe and the relative concentrations of Si and Ge are varied during deposition to provide a heterojunction with the source area. Drain layer 118 can be 3 to 10 nm thick. The cap 116 is then removed using conventional etching techniques. In step 515, a gate stack 120 is then formed and patterned as shown in FIG. 12H. To form gate stack 120, a high-K gate dielectric is first deposited using ALD to a thickness of 10 to 30 Å. High-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The conductive gate is then formed by ALD. The conductive gate may be doped polycrystalline silicon or may comprises a metal selected from a group of W, Cu, Ti, Ag, Al, TiAl, TiAlN, TaC, TaCN, TaSiN, Mn, Zr, TiN, WN, TaN, and Ru or combinations thereof. In some embodiments, the conductive gate has a thickness in the range of about 30 nm to about 60 nm.

Figure 12I:
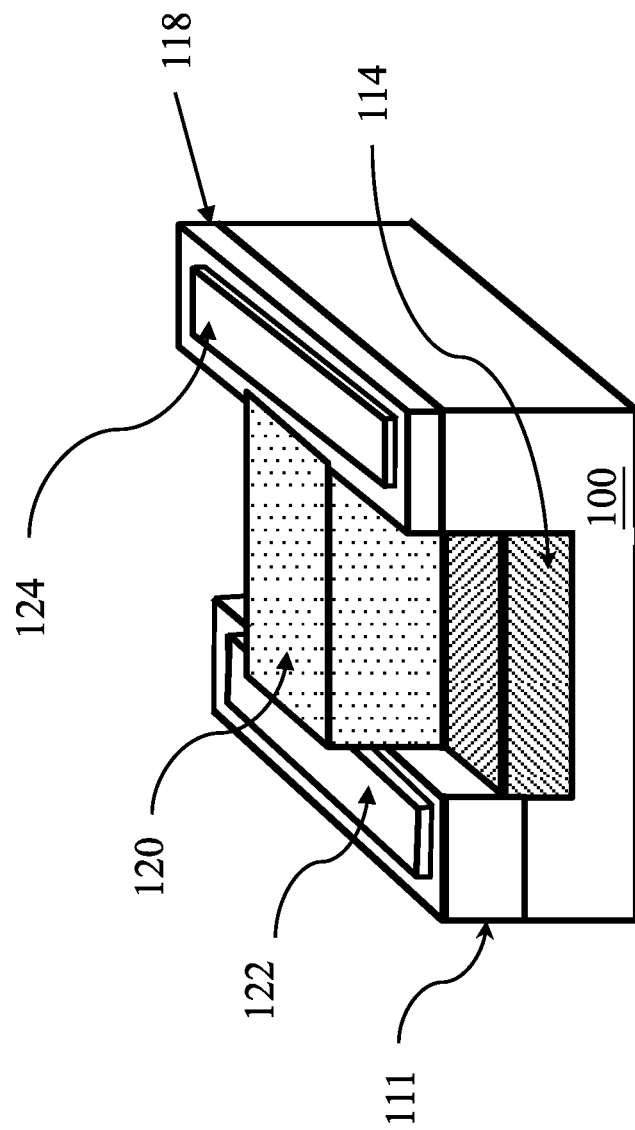

In step 517, source contact 122 and drain contact 124 are deposited and patterned on the source region 111 and drain region 118, respectively, as shown in FIG. 12I. In one example, source contact 122 and drain contact 124 include a barrier layer and a conductive layer deposited afterwards. The barrier layer may promote adhesion of the conductive layer. In addition, if the conductive layer is made of diffusive element, such as Cu, the barrier layer blocks diffusion into neighboring layers or structures. In some embodiments, the barrier layer includes Ti, TiN, Ta, TaN, or combinations thereof. The barrier layer may be formed by PVD, ALD, or other applicable processes. In some embodiments, the thickness of layer is in a range from about 1 nm to about 10 nm.

The conductive layer may be made of any conductive metal or metal alloy. Examples of suitable conductive metals include, but are not limited to, Cu, Al, W, Pt, Au, Ag, etc. The conductive layer may be formed by plating, PVD, ALD, or other applicable processes.

Figure 13:
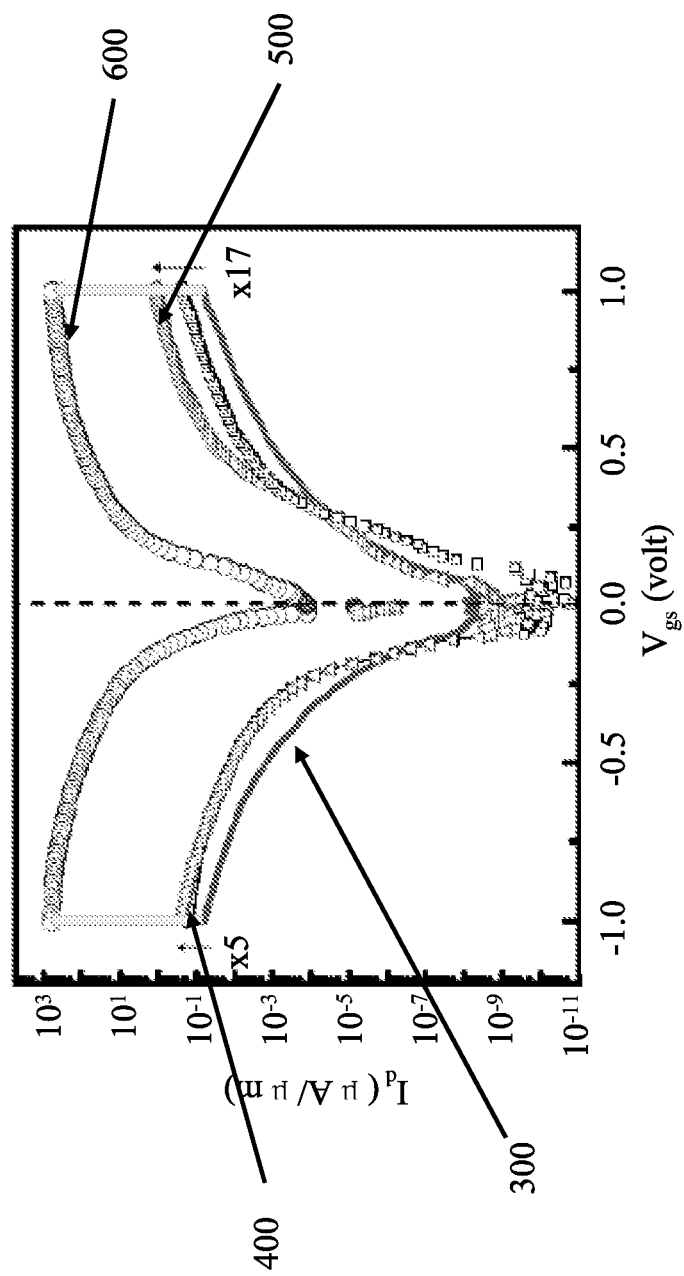
FIG. 13 is a graph showing the performance characteristics of a TFET in accordance with some embodiments.

FIG. 13 is a graph showing the improved performance of the forgoing examples relative to conventional TFETs. Line 300 shows the subthreshold performance of conventional TFETs (the left-hand side of the graph is p-type and the right-hand side is n-type). Line 400 shows the performance of an overlapping or staggered TFET according to the above examples with a simple PN type tunneling barrier. This shows an approximate fivefold increase in drive current over conventional TFETs. Line 500 shows a TFET according to the above examples where the drain is formed using SiGe on a silicon substrate. This shows an approximate seventeen-fold increase in drive current over conventional TFETs. Line 600 shows a TFET according to the above examples with a SiGe drain on a silicon substrate with a heterojunction profile at the transition from SiGe to silicon. As can be seen, this provides a drive current increase of approximately four orders of magnitude over conventional TFETs.

The above examples show structures for and processes for fabricating a staggered or overlapping structure tunneling field effect transistor. The process is compatible with current CMOS manufacturing techniques, thus minimizing the cost for incorporating this new transistor into current production facilities. More importantly, applying the techniques taught in this specification can provide a TFET with drive current four orders of magnitude greater than conventional TFETs. This greater drive current along with a low subthreshold swing (FIG. 13) and low threshold voltage makes the examples described herein attractive for use in high-density, low-power integrated circuits.

A tunneling field effect transistor is described including a doped region formed in a semi-conductive substrate. An epitaxial region is formed overlapping the doped region in an overlapping region. A gate is formed adjacent to the overlapping region. The doped region serves as a drain and the epitaxial region serves as the source of the tunneling field effect transistor.

A tunneling field effect transistor is described including a doped region formed in a crystalline silicon substrate. A silicon-germanium epitaxial region is formed overlapping the doped region in an overlapping region. A gate is formed adjacent to the overlapping region. The doped region serves as a drain and the epitaxial region serves as the source of the tunneling field effect transistor.

A method for forming a tunneling field effect transistor is described including forming a doped region formed in a semi-conductive substrate. An epitaxial region overlapping the doped region is deposited to form an overlapping region. A gate is formed adjacent to the overlapping region. The doped region serves as a drain and the epitaxial region serves as the source of the tunneling field effect transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A tunneling field effect transistor comprising:
a semiconductor substrate comprising a doped region and a region outside the doped region;
an epitaxial region above the semiconductor substrate in a first direction perpendicular to a major surface of the semiconductor substrate, the epitaxial region extending above both the doped region and the region outside the doped region, wherein a top surface of the epitaxial region is level with a top surface of the doped region;
a gate overlapping above the epitaxial region and the doped region; and
a first dielectric layer extending along a sidewall of the gate, the first dielectric layer extending above the epitaxial region, wherein the epitaxial region extends past the sidewall of the gate in a second direction parallel to the major surface of the semiconductor substrate.

2. The tunneling field effect transistor of claim 1, wherein the gate is in physical contact with the epitaxial region.

3. The tunneling field effect transistor of claim 1, wherein the gate extends laterally between the first dielectric layer and a second dielectric layer in the second direction, wherein an edge of the doped region is aligned with an edge of the second dielectric layer in the first direction.

4. The tunneling field effect transistor of claim 3, wherein an edge of the epitaxial region is aligned with an edge of the first dielectric layer in the first direction.

5. The tunneling field effect transistor of claim 4, wherein the edge of the epitaxial region is aligned with a first edge of the gate in the first direction, and wherein the edge of the doped region is aligned with a second edge of the gate opposite the first edge of the gate in the first direction.

6. The tunneling field effect transistor of claim 1, wherein the top surface of the epitaxial region is above a top surface of the region of the semiconductor substrate outside the doped region.

7. The tunneling field effect transistor of claim 1, wherein the epitaxial region comprises silicon germanium.

8. The tunneling field effect transistor of claim 1, wherein the epitaxial region physically contacts the doped region and the region outside the doped region.

9. A tunneling field effect transistor comprising:
a doped region in a crystalline silicon substrate;
a silicon-germanium epitaxial region above at least a portion of the doped region in a first direction perpendicular to a major surface of the crystalline silicon substrate, wherein the doped region serves as a first region selected from one of a source region or a drain region and the silicon-germanium epitaxial region serves as a second region selected from the other of the source region or the drain region of the tunneling field effect transistor;
a gate above the doped region and the silicon-germanium epitaxial region;
a first dielectric layer above the doped region, the first dielectric layer extending from a top surface of the doped region to a same level as a top surface of the gate; and
a second dielectric layer above the silicon-germanium epitaxial region, the second dielectric layer extending from a top surface of the silicon-germanium epitaxial region to a same level as the top surface of the gate, wherein a vertical length of the first dielectric layer is equal to a vertical length of the second dielectric layer.

10. The tunneling field effect transistor of claim 9, wherein the silicon-germanium epitaxial region is further above at least a portion of a region of the crystalline silicon substrate outside the doped region.

11. The tunneling field effect transistor of claim 9, wherein a first edge of the doped region is aligned with a first edge of the gate in the first direction.

12. The tunneling field effect transistor of claim 11, wherein a first edge of the silicon-germanium epitaxial region is aligned with a second edge of the gate opposite the first edge of the gate in the first direction.

13. The tunneling field effect transistor of claim 9, wherein the gate comprises a gate insulator extending along and physically contacting the top surface of the silicon-germanium epitaxial region and a gate electrode above the gate insulator.

14. The tunneling field effect transistor of claim 13, wherein the gate insulator and the gate electrode are in physical contact with sidewalls of the first dielectric layer and the second dielectric layer.

15. A semiconductor device comprising:
a doped region and region outside the doped region in a semiconductor substrate;
an epitaxial layer extending above the doped region and the region outside the doped region in a first direction perpendicular to a major surface of the semiconductor substrate, wherein a top surface of the epitaxial layer is level with a top surface of the doped region; and
a gate above the epitaxial layer and the doped region, wherein a first edge of the gate is aligned with a first edge of the doped region in the first direction, wherein a second edge of the gate opposite the first edge of the gate is aligned with a first edge of the epitaxial layer in the first direction, and wherein the epitaxial layer extends from the first edge of the epitaxial layer past the first edge of the gate and the first edge of the doped region in a second direction parallel to the major surface of the semiconductor substrate.

16. The semiconductor device of claim 15, wherein the epitaxial layer comprises a compound semiconductor material.

17. The semiconductor device of claim 15, wherein the gate is in physical contact with the epitaxial layer.

18. The semiconductor device of claim 17, wherein the epitaxial layer physically separates the gate from the doped region.

19. The semiconductor device of claim 15, wherein the doped region is disposed over the region outside the doped region, wherein a top surface of the region outside the doped region is level with the top surface of the doped region.

20. The semiconductor device of claim 15, further comprising:
- a first dielectric layer over the doped region, the first dielectric layer extending along the second edge of the gate; and
- a second dielectric layer above the epitaxial layer, the second dielectric layer extending along the first edge of the gate, wherein a first vertical length of the first dielectric layer in the first direction is equal to a second vertical length of the second dielectric layer in the first direction.

* * * * *